United States Patent
Kienzle et al.

(10) Patent No.: US 6,903,337 B2
(45) Date of Patent: Jun. 7, 2005

(54) EXAMINING SYSTEM FOR THE PARTICLE-OPTICAL IMAGING OF AN OBJECT, DEFLECTOR FOR CHARGED PARTICLES AS WELL AS METHOD FOR THE OPERATION OF THE SAME

(75) Inventors: Oliver Kienzle, Aalen (DE); Dirk Stenkamp, Essingen (DE); Michael Steigerwald, Aalen (DE); Rainer Knippelmeyer, Aalen (DE); Max Haider, Gaiberg (DE); Heiko Müller, Heidelberg (DE); Stephan Uhlemann, Heidelberg (DE)

(73) Assignee: Carl Zeiss SMT AG, Oberkochen (DE)

( * ) Notice: Subject to any disclaimer, the term of this patent is extended or adjusted under 35 U.S.C. 154(b) by 8 days.

(21) Appl. No.: 10/185,729

(22) Filed: Jul. 1, 2002

(65) Prior Publication Data

US 2003/0066961 A1 Apr. 10, 2003

(30) Foreign Application Priority Data

Jul. 2, 2001 (DE) .......................................... 101 31 931
Dec. 14, 2001 (DE) .......................................... 101 61 526

(51) Int. Cl.$^7$ .............................................. H01J 37/28
(52) U.S. Cl. ...................................... 250/306; 250/310
(58) Field of Search .............................. 250/306, 307, 250/310, 311

(56) References Cited

U.S. PATENT DOCUMENTS

| | | | |
|---|---|---|---|
| 4,376,249 A | 3/1983 | Pfeiffer et al. | |
| 4,740,704 A | 4/1988 | Rose et al. | |
| 4,769,543 A | 9/1988 | Plies | |
| 4,827,127 A | 5/1989 | Todokoro | |
| 4,877,326 A | 10/1989 | Chadwick et al. | |
| 4,912,405 A | 3/1990 | Richardson | |
| 4,978,855 A | 12/1990 | Liebl et al. | |
| 5,424,541 A | 6/1995 | Todokoro et al. | |
| 5,545,902 A | 8/1996 | Pfeiffer et al. | |
| 5,576,833 A | 11/1996 | Miyoshi et al. | |
| 5,578,821 A | 11/1996 | Meisberger et al. | |
| 5,616,920 A | 4/1997 | Plies | |

(Continued)

FOREIGN PATENT DOCUMENTS

| | | |
|---|---|---|
| DE | 27 33 966 | 5/1980 |
| DE | 39 04 032 | 7/1993 |
| DE | 196 34 456 | 3/1998 |

(Continued)

OTHER PUBLICATIONS

H. Ohiwa, "Design of electron–beam scanning systems using the moving objective lens", J. Vac. Sci. Technol., 15(3), May/Jun. 1978, pp. 849–852.

(Continued)

*Primary Examiner*—Kiet T. Nguyen
(74) *Attorney, Agent, or Firm*—Burns, Doane, Swecker & Mathis, L.L.P.

(57) ABSTRACT

An examining system for imaging an object positionable in an object plane, includes an illumination device for supplying energy to a delimited field of the object such that charged particles emerge from locations of the field, the field being displaceable in the plane of the object, a first deflector for providing a variable deflection field for guiding charged particles emerging from locations of a selectable region of the object through a fixed, predetermined beam cross-section, and a position-sensitive detector disposed in the beam path such that the charged particles, after having passed through the first deflector, impinge on the position-sensitive detector, wherein particles emerging from different locations of the region are imaged on different locations of the position-sensitive detector which are allocated to the locations of emergence.

34 Claims, 12 Drawing Sheets

U.S. PATENT DOCUMENTS

| | | | |
|---|---|---|---|
| 5,757,010 A | 5/1998 | Langner |
| 5,973,323 A | 10/1999 | Adler et al. |
| 6,002,128 A | 12/1999 | Hill et al. |
| 6,067,164 A | 5/2000 | Onoguchi et al. |
| 6,087,046 A | 7/2000 | Nakasuji |
| 6,087,659 A | 7/2000 | Adler et al. |
| 6,087,667 A | 7/2000 | Nakasuji et al. |
| 6,107,637 A | 8/2000 | Watanabe et al. |
| 6,110,626 A | 8/2000 | Nakasuji |
| 6,110,627 A | 8/2000 | Nakasuji |
| 6,114,709 A | 9/2000 | Nakasuji |
| 6,117,600 A | 9/2000 | Nakasuji |
| 6,124,596 A | 9/2000 | Nakasuji et al. |
| 6,125,522 A | 10/2000 | Nakasuji |
| 6,144,037 A | 11/2000 | Ryan et al. |
| 6,153,340 A | 11/2000 | Nakasuji |
| 6,162,581 A | 12/2000 | Nakasuji et al. |
| 6,172,363 B1 | 1/2001 | Shinada et al. |
| 6,184,526 B1 | 2/2001 | Kohama et al. |
| 6,194,102 B1 | 2/2001 | Nakasuji et al. |
| 6,218,664 B1 | 4/2001 | Krans et al. |
| 6,218,676 B1 | 4/2001 | Nakasuji |
| 6,235,450 B1 | 5/2001 | Nakasuji |
| 6,259,094 B1 | 7/2001 | Nagai et al. |
| 6,265,719 B1 * | 7/2001 | Yamazaki et al. ......... 250/310 |
| 6,284,415 B1 | 9/2001 | Nakasuji |
| 6,300,023 B1 | 10/2001 | Nakasuji |
| 6,307,209 B1 | 10/2001 | Nakasuji et al. |
| 6,326,633 B2 | 12/2001 | Nakasuji |
| 6,337,164 B1 | 1/2002 | Nakasuji |
| 6,352,799 B1 | 3/2002 | Nakasuji |
| 6,388,261 B1 | 5/2002 | Nakasuji |
| 6,414,319 B1 | 7/2002 | Spehr |
| 6,479,819 B1 | 11/2002 | Hamashima et al. |
| 2001/0008274 A1 | 7/2001 | Nakasuji |
| 2001/0025932 A1 | 10/2001 | Nakasuji |
| 2001/0026929 A1 | 10/2001 | Nakasuji |
| 2002/0028399 A1 | 3/2002 | Nakasuji et al. |
| 2002/0033449 A1 | 3/2002 | Nakasuji et al. |
| 2002/0036264 A1 | 3/2002 | Nakasuji et al. |
| 2002/0084422 A1 | 5/2002 | Klenzie et al. |

FOREIGN PATENT DOCUMENTS

| | | |
|---|---|---|
| DE | 199 44 857 | 3/2001 |
| DE | 100 44 199 | 6/2002 |
| EP | 0 218 920 | 1/1994 |
| EP | 1 045 425 | 10/2000 |
| EP | 1 117 125 | 7/2001 |
| JP | 11-132975 | 5/1999 |
| JP | 11-148905 | 6/1999 |
| JP | 11-162384 | 6/1999 |
| JP | 2002-164011 | 6/2002 |
| WO | WO 99/09582 A1 | 2/1999 |
| WO | WO 00/19482 | 4/2000 |
| WO | WO 01/22469 | 3/2001 |

OTHER PUBLICATIONS

G. Kerkhoff et al., "New lens design with an extremely wide scanning area in one direction", Licht—Und Teilchenoptik, Institut für angewandle Physik, Annual Report 1996/1997, pp. 112–113.

Goto, et al., "MOL (moving objective lens) Formulation of Deflective Aberration Free System", Optik 48, No. 3, 1977, pp. 255–270.

X. Zhu et al., "Comprehensive Analysis of Electron Optical Design of SCALPEL–HT/Alpha", Proc. SPIE, vol. 3997, pp. 170–183, Jul., 2000, Emerging Lithographic Technologies IV, Elizabeth A. Doblisz; Ed.

* cited by examiner

EXAMINING SYSTEM FOR THE PARTICLE-OPTICAL IMAGING OF AN OBJECT, DEFLECTOR FOR CHARGED PARTICLES AS WELL AS METHOD FOR THE OPERATION OF THE SAME

BACKGROUND OF THE INVENTION

The invention relates to an examining system for the two-dimensional imaging of structures of an object on a receiver, such as a camera, by means of charged particles, such as electrons. In particular, the examined structures may be structures which are usually examined by electron-microscopy, wherein backscattering electrons, secondary electrons, transmission electrons or photoelectrons emerging from the object are observed. The invention is not intended to be limited to these types of electrons. In particular, the observation of ions emerging from the object is also contemplated.

Furthermore, the invention relates to a deflector for beams of charged particles. In particular, said deflector is suitable for use in the examining system for examining the object. However, the use of the deflector is not intended to be limited to this application. Moreover, the invention relates to a method for the operation of the deflector.

A possible field of application of the examining system is in methods for the manufacture of miniaturized devices and, here, in particular, for localizing defects of the devices during the manufacture of the same and of the masks used for this purpose, such as lithography masks. U.S. Pat. No. 5,578,821 discloses an examining system for this purpose wherein an electron beam is focused onto a point (pixel) of the object to be examined. Backscattering electrons, secondary electrons and transmission electrons emerging from the object are recorded by appropriate detectors. In this system, a deflector is used to displace the location where the focused beam impinges on the object. The respective detectors integrally receive all backscattering, secondary and transmission electrons independent of the displacement of the location. The detectors as such are not position-sensitive, but it is possible to obtain a position-resolved image of the structures of the object if the intensity recorded by a detector is allocated to the point determined by the deflector where the beam impinges on the object. By operation of the deflector, the beam is then successively deflected to the different locations (pixels) of the object, the measured intensities allocated to the different locations are recorded and the two-dimensional image is composed of the successively recorded intensities. This method is very time-consuming.

U.S. Pat. No. 6,097,659 discloses an examining system, wherein a two-dimensionally extended field on the object is irradiated with primary electrons and wherein secondary electrons emerging from the object are imaged on a position-sensitive detector. In contrast to the system disclosed in U.S. Pat. No. 5,578,821, this renders a sequential scanning of pixels by means of a deflector superfluous. Rather, a multiplicity of pixels can be simultaneously detected. However, if a high magnification of the image is desired, the field imaged on the detector is too small to image an object of larger two-dimensional extension at once. Therefore, a mechanical shift table is provided for the object to be displaced relative to the illuminated field, so that the detector can pick up, successively in time, a plurality of images of the object, the latter being displaced step-by-step, in order for an image of the entire object to be eventually obtained by combining the plurality of images. This, again, is very time-consuming and, moreover, requires a shift table whose mechanical precision corresponds about to the desired resolution of the image.

SUMMARY OF THE INVENTION

Accordingly, it is an object of the present invention to provide an examining system for imaging an object which enables two-dimensionally extended objects to be imaged relatively quickly.

Moreover, it is an object of the invention to provide an examining system, wherein the requirements to be met by a mechanical displacement of the object relative to the examining system are reduced.

According to a first aspect, the invention provides an examining system for imaging an object which is positionable in an object plane, said examining system comprising a position-sensitive detector on which charged particles emerging from the object in a two-dimensionally extended field are imaged.

Moreover, a first deflector is provided which produces a variable deflection field to displace in the plane of the object the region which is imaged on the detector by means of the charged particles. The first deflector serves to guide the charged particles entering the first deflector from different directions, dependent upon the displacement of said region in the object plane, through a substantially fixed, predetermined beam cross-section.

Here, the particle beam is constantly directed to a same sector of the detection area of the detector independent of the position of the imaged region in the object plane. The location of projection of the imaged region on the detection area is not displaced when the region imaged on the detector is displaced. In particular, the particle beam traverses the fixed beam cross-section independent of the position of said region always substantially in a same direction, for example, parallel to an optical axis.

After having passed through this beam cross-section, which is independent of the displacement of the imaged region in the object plane, the charged particles may pass through an optical system in order to increase the image magnification and, eventually, impinge on the position-sensitive detector. Due to the displaceability of the region of the object plane which is imaged on the detector, it is possible to two-dimensionally image structures of relatively large objects without having to mechanically move the object relative to the examining system.

The examining system further comprises an illumination system for supplying energy to the object such that charged particles emerge from locations of the object, said emerging particles being subsequently supplied to the detector to obtain the image of the object. The energy can be supplied to the object in the form of charged particles, in particular, electrons, or in the form of electromagnetic radiation (light). Accordingly, the illumination system then comprises a light source, such as a laser, or a particle source, in particular, an electron source. The particles emerging from the object as a result of the energy supply are preferably photoelectrons or backscattering electrons, secondary electrons or transmission electrons.

The examining system further comprises a controller for controlling the first deflector such that the region of the object imaged on the detector is changed, the controller being further provided to control the illumination system in order to displace the delimited field in which energy is supplied to the object together with the region in the plane of the object which is imaged on the detector. Preferably, the illuminated field substantially coincides with the region imaged on the detector.

Accordingly, it is not the entire object which is supplied with energy. Rather, merely a region thereof is supplied with energy in order to keep the thermal stress which the object is subjected to to a minimum. As a result, a reduction of the particle flow is achieved in addition, so that, for example, space charge effects are reduced. If the illuminated field and the imaged region coincide, the thermal stress which the object is subjected to is not higher than it is absolutely necessary for producing the image of the object.

Between the object and the location in the beam path where the charged particles extending towards the detector traverse the fixed beam cross-section, there is preferably provided a first focusing lens device having the effect of a focusing lens on the particles emerging from the object. In order to attain a sufficient magnification of the image, said focusing lens device is to be positioned relatively close to the object. Moreover, if use is made of a conventional rotationally symmetric magnetic lens, the bore diameter thereof must be selected to be relatively small in order to avoid aberrations, so that, when a round lens with small bore diameter is positioned close to the object, the region which is imaged on the detector cannot be displaced in the plane of the object to such an extent as it would be desired for the imaging of large-area objects without mechanical movement of the same relative to the examining system. Therefore, preferably lens devices are used here as first focusing lens device which differ from the magnetic round lens as it is employable in the other components of the examining system, such as a further optical magnification system in front of the detector.

A preferred possible embodiment of the first focusing lens device which provides its focusing deflection field over a relative large area transverse to the beam direction is disclosed in German patent application no. 196 34 456 A1, the full disclosure of said document being incorporated into the present application by reference. Said focusing lens device comprises a cylindrical lens and a quadrupole lens fixedly positioned in respect of the cylindrical lens. The axis of the cylindrical lens extends transversely to the beam direction and focuses the beam in a direction transverse to the axial direction of the cylindrical lens. A main axis of the quadrupole lens substantially coincides with the axis of the cylindrical lens, and the field of the cylindrical lens and the field of the quadrupole lens cooperate to produce a focusing effect on charged particles traversing the lens arrangement.

A further preferred embodiment of the first focusing lens device is described in German patent application no. 199 44 857 A1, the full disclosure of which is incorporated into the present application by reference. The focusing lens device disclosed therein likewise comprises a cylindrical lens, the axis of which extends transversely to the beam direction. The deflection field provided by the cylindrical lens is likewise superposed by a quadrupole field which is, however, not stationary but displaceable in the direction of the cylinder axis. To this end, the lens arrangement comprises a plurality of electrodes which are disposed in oppositely arranged pairs along the cylinder axis. Voltages can be selectively applied to the electrodes such that they provide an electric field with quadrupole symmetry at a selectable position along the cylinder axis. When use is made of such a first focusing lens device, the controller is furthermore provided to position the location of the currently produced quadrupole field about centrally in respect of a bundle of charged particles which emerge from the region imaged on the detector when it is correspondingly deflected in the plane of the object.

Moreover, it is preferred to provide the first focusing lens device as variable axis lens. Such a lens is described in the article "MOL" ("Moving Objective Lens"), Optic 48 (1977), pages 255 et seq., by E. Goto et al. or in U.S. Pat. No. 4,376,249.

A preferred embodiment of the first focusing lens device as magnetic variable axis lens is described in applicant's copending German patent application no. 100 44 199.8 and corresponding U.S. patent application Ser. No. 09/949,193, Japanese patent applications no. 2001-272363, patent application no. 90122060 in Taiwan and Korean patent application no. 10-2001-0054790, which documents are likewise incorporated into the present application by reference. This focusing lens device comprises a magnetic lens which produces a static, rotationally symmetric deflection field and, furthermore, a coil arrangement which is disposed within the rotationally symmetric magnetic field and produces there a dipole field of adjustable magnitude. The superposition of the rotationally symmetric magnetic field and the dipole field, the field direction thereof being oriented transversely to the axis of symmetry of the magnetic lens and the beam direction, results likewise into a rotationally symmetric focusing field, the axis of symmetry of which, however, is displaced in respect of the axis of symmetry of the static lens dependent upon the strength of the dipole field. Preferably, the strength of the dipole field and thus the displacement of the effective optical axis of the focusing lens device is likewise adjusted by the controller such that the axis displacement is effected together with the displacement of the illuminated field and the region of the object in the object plane imaged on the detector.

Preferably, the control is effected such that the optical axis of the focusing lens field provided by the first focusing lens device intersects the region imaged on the detector, in particular, centrally.

Preferably, the examining system is configured such that backscattering electrons or/and secondary electrons or/and transmission electrons or/and photoelectrons emerging from the object are imaged on the corresponding detector.

In order for the photoelectrons to be imaged on the detector, the illumination system then comprises a photon source to illuminate the field in the object plane. The photons emitted by the photon source are preferably directed to a movable deflector which reflects the photons onto the object. The movement of the deflector is controlled by the controller to attain the deflection of the illuminated field in the object plane by changing the orientation of the deflector.

In order to image transmission electrons on the detector, the examining system comprises an electron source and an aperture to form the electrons emitted by the source to a beam which illuminates the field in the object plane. Moreover, a second deflector is provided to deflect the electron beam transversely to its beam direction and to thus attain the displacement of the illuminated field in the object plane. The first deflector and the detector are in this case disposed on a side of the object which is opposed to the source in respect of the object plane for detecting the transmission electrons traversing the object.

In order to detect backscattering and secondary electrons, respectively, the source and the detector are disposed on the same side of the object in respect of the object plane. Preferably, the first deflector is then not only used to displace the region in the object plane which is imaged on the detector by emerging electrons, but also serves to displace the field in the object plane which is illuminated by electrons emerging from the source. The first deflector is then traversed in one direction by the electron beam extending from the source to the object and in the other direction by the electron beam extending from the object to the detector. Generally, the kinetic energy of the electrons travelling from the source to the object is higher than that of the electrons travelling from the object to the detector. Preferably, the deflector is provided such that it provides substantially the same deflection angle for the electrons travelling in both directions.

Such a deflector constitutes a second aspect of the present invention.

To this end, the invention provides for a deflector which produces an electric deflection field and a magnetic deflection field in a three-dimensional volume, the directions of movement of the electrons and the field directions of the electric field and the magnetic field being respectively oriented in pairs approximately orthogonally relative to each other.

For example, the electric deflection field can be provided by an electrode arrangement, and the magnetic deflection field can be provided by a current conductor winding arrangement. In this case, according to the invention, there is provided a controller for adjusting currents flowing through the current conductor winding arrangement and voltages applied to the electrode arrangement such that the electrons travelling from the source to the object and the electrons travelling from the object to the detector move on substantially the same or similar trajectories.

According to a further aspect of the invention, in order to attain a precise deflection of the electrons moving in opposite directions through the deflector, the deflector is provided such that it comprises a plurality of axially spaced apart rings made of a material having a high magnetic permeability, and each of the current conductor windings engages at least around one of the rings. The material having a high magnetic permeability is a material, the permeability of which is considerably higher than that of the vacuum.

In order to avoid eddy currents, this material is preferably electrically non-conductive or an electric insulator. An example of such a material is a ferrite.

Preferably, the electrodes of the electrode arrangement are disposed radially inside of the rings and the current conductor windings wound thereupon. When the charged particles are guided in vacuum, according to a preferred embodiment, the current conductor winding arrangement is provided outside of a corresponding vacuum shell and the electrode arrangement is disposed radially inside of the vacuum shell.

In order to change the deflection angles provided for the electrons by the deflector, the controller changes the strengths both of the electric field and the magnetic field in the deflection volume. Preferably, the change of the field strengths is performed such that the ratio between the strength of the magnetic field and the strength of the electric field is constant independent of the deflection angle. Preferably, this ratio is substantially equal to the difference of the velocities of the electrons travelling from the source to the object and from the object to the detector, when they traverse the deflector, divided by the product of these two velocities.

BRIEF DESCRITPION OF THE DRAWINGS

Embodiments of the invention are described below with reference to the accompanying drawings, wherein FIG. 1 is a schematic representation of an embodiment of the examining system according to the invention, wherein secondary electrons are observed;

DETAILED DISCRIPTION OF THE INVENTION

Figure 1:
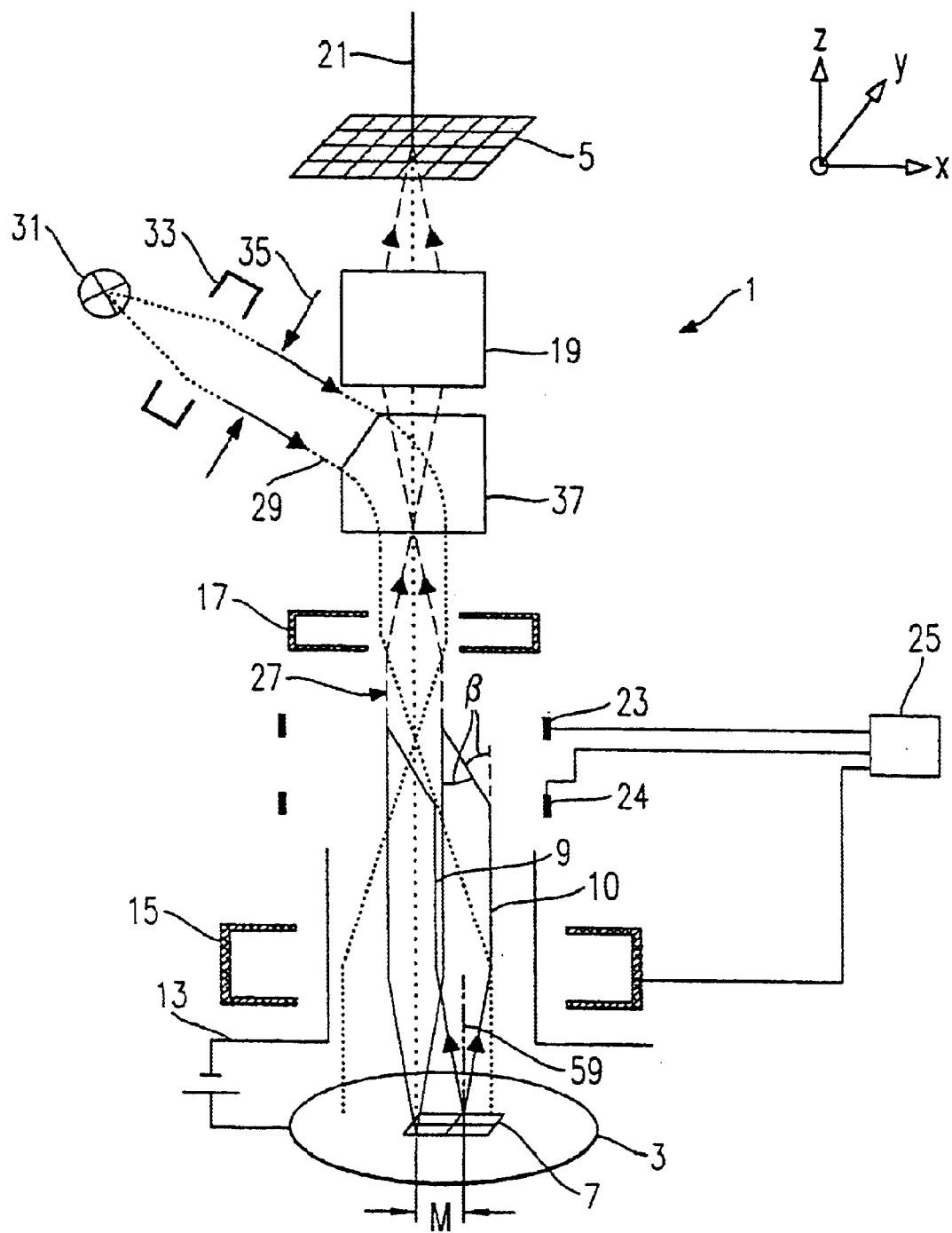

FIG. 1 is a schematic representation of a first embodiment of the examining system 1 according to the invention. The examining system 1 serves to image structures of an object 3, such as a semiconductor wafer 3, or other miniaturized structures, such as a lithography mask, or also a biological specimen, for example. The structures of the object 3 are examined in that secondary electrons emerging from the object 3 are imaged on a position-sensitive detector 5. The detector 5 is position-sensitive in two dimensions in that it comprises a plurality of picture points or pixels which are arranged in a two-dimensional matrix. Each pixel collects information which can be read out and is representative of an electron intensity impinging on the pixel during an exposure time interval.

Preferably, the detector is a device which is capable of integrating, in terms of time, an intensity distribution of charged particles impinging on the detection area in two-dimensionally resolved manner. The information detected in this way may be supplied for further processing to an external processing unit which may, for example, also form part of a control unit which controls the whole system. In particular, the detector may consist of one or more CCD chips.

Between the object 3 and the detector 5, there are provided electron-optical components for imaging a two-dimensionally limited rectangular field 7 in the plane of the object 3 on the detector 5. The imaging is effected such that secondary electrons emerging from different locations of the field 7 impinge on different pixels of the detector 5. Accordingly, structures of the object 3 which differ from each other as regards the intensity of emitted secondary electrons can be graphically represented.

In FIG. 1, the trajectories 9, 10 of two secondary electrons emerging from a location of the field 7 at different angles are symbolically represented. The secondary electrons emerging from the object 3 with a kinetic energy of from 0 eV to about 5 eV are at first accelerated to a kinetic energy of about 20 keV. The acceleration is effected by an electric field which is provided between the object 3 and an electrode 13 disposed in front of the object. After having been accelerated, the electrons pass through a focusing lens doublet comprising a focusing lens 15 disposed close to the object and a further focusing lens 17. The electrode 13 cooperates with the focusing lens 15 disposed close to the object, and together they define a first focusing unit of the doublet, the second focusing unit thereof being defined by the further focusing lens 17. The first and second focusing units together have an effect on the secondary electrons which corresponds to an effect of a telescopic doublet.

After the electrons have traversed the doublet, an image magnification is performed by means of a schematically represented further optical magnification system 19, which may comprise one or more particle-optical lenses and other components, before the electrons impinge on the detector 5.

The focusing lenses 15, 17, the further optical magnification system 19 and the detector 5 are centered in respect of a main axis 21 of the examining system. However, the field 7 which is electron-optically imaged on the detector 5 is displaceable in respect of the main axis 21 in an x-direction transversely to the main axis 21. To this end, two deflectors 23 and 24 are disposed between the two focusing lenses 15 and 17. FIG. 1 shows a situation in which the center of the field 7 imaged on the detector 5 is displaced from the main axis 21 in x-direction by a distance M. After having traversed the focusing lens 15 disposed close to the focusing lens 15, the trajectories of the electrons extend parallel to the z-axis or main axis 21. The deflector 24 disposed closer to the object causes the trajectories to be deflected through an angle β such that the electrons extend towards the main axis 21. Subsequently, the deflector 23 disposed more remotely from the object 3 causes the electrons to be deflected through an angle −β such that the electrons again extend parallel to the z-axis. The deflection M of the field 7 away from the main axis 21 is thus determined by the distance which the two deflectors 23, 24 are spaced apart from each other and the deflection angles β provided by the deflectors 23 and 24, respectively.

Moreover, a controller 25 is provided for controlling the deflectors 23 and 24 such that the deflection angle β, and thus the deflection M of the field 7 away from the main axis 21, is adjusted. The angles β are adjusted such that the secondary electrons, after having traversed the deflector 23 disposed remote from the object 3, pass through a beam cross-section which is independent of the deflection M and fixedly positioned in respect of the examining system. This beam cross-section, which is independent of the deflection M, is designated in FIG. 1 by the reference number 27 and is centered in respect of the main axis 21. After having passed through the beam cross-section, which is designated by reference number 27 and independent of the deflection, the electrons travel on to the detector in a beam path which is likewise independent of the deflection M. In the embodiment shown in FIG. 1, this further beam path extending to the detector is likewise centered in respect of the main axis 21. However, it is possible to provide here, too, beam deflectors and other components, such as energy filters, which guide the beam between the cross-section 27, which is independent of the deflection, and the detector 5 away from the main axis 21.

In order to extract secondary electrons from the field 7 of the object 3 imaged on the detector 5, said field 7 is illuminated with primary electrons. A primary electron beam 29 is shaped by an electron gun 31, a magnetic lens 33 and a beam-shaping aperture plate 35. The kinetic energy of the primary electrons of the beam 29 is about 22 keV. Aperture plates are also referred to herein as apertures.

The primary electron beam 29 is superposed by the secondary electron beam extending towards the detector 5 by means of a beam combiner 37. The beam combiner 37 is positioned in the beam path of the secondary electrons between the focusing lens 17 and the further optical magnification system 19 and is straightly traversed by the secondary electrons. The primary electrons, which enter the beam combiner 37 inclined in respect of the main axis 21, are deflected by the beam combiner 37 such that the primary electrons, after having traversed the beam combiner 37, move along the main axis 21 towards the object 3.

After having passed through the beam combiner 37, the primary electrons pass through the focusing lens 17 and the beam cross-section 27, which is independent of the deflection M, and then pass through the deflector 23 which deflects the same through an angle β away from the main axis 21. Subsequently, the primary electrons are deflected by the deflector 24 towards the main axis 21 through an angle −β, so that, eventually, they extend again in parallel to the main axis, the primary electrode beam, however, having likewise been displaced away from the main axis 21 by the distance M by means of the two deflectors 23, 24. The primary electrons then pass through the focusing lens 15 and are decelerated to a kinetic energy of about 2 keV by the electric field produced by the electrode 13 before they impinge on the object 3 in the field 7 and extract the secondary electrons there.

The kinetic energy of about 2 keV, as indicated here, for generating the secondary electrons is an exemplary value. The primary electrons may also be decelerated to other energies, for example, to energies in the range of from 100 eV to 5 keV.

Figure 3:
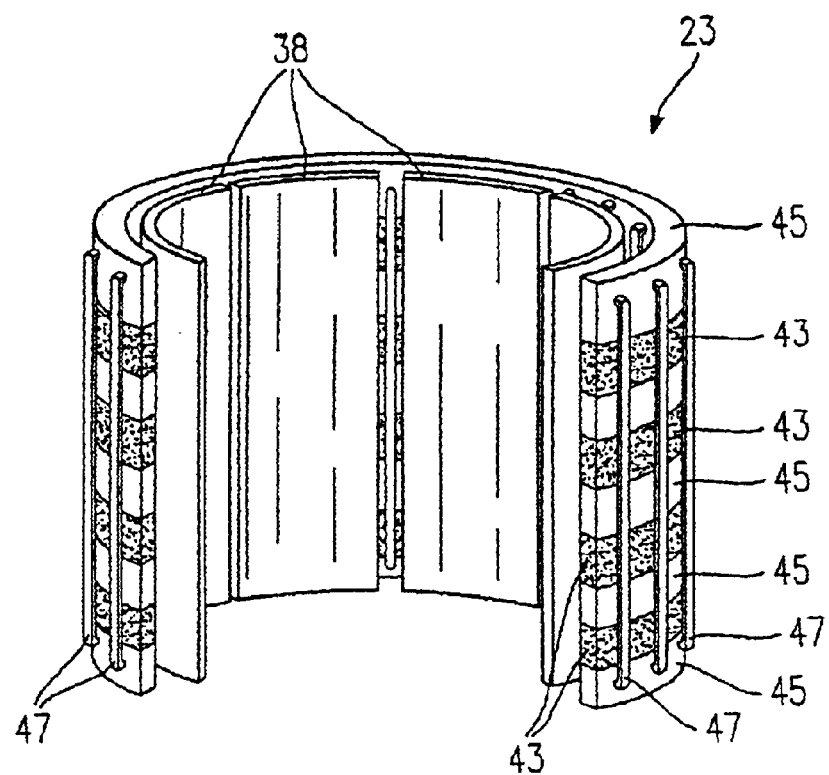
FIG. 3 is a perspective representation of the deflector illustrated in FIG. 2.
Figure 4:
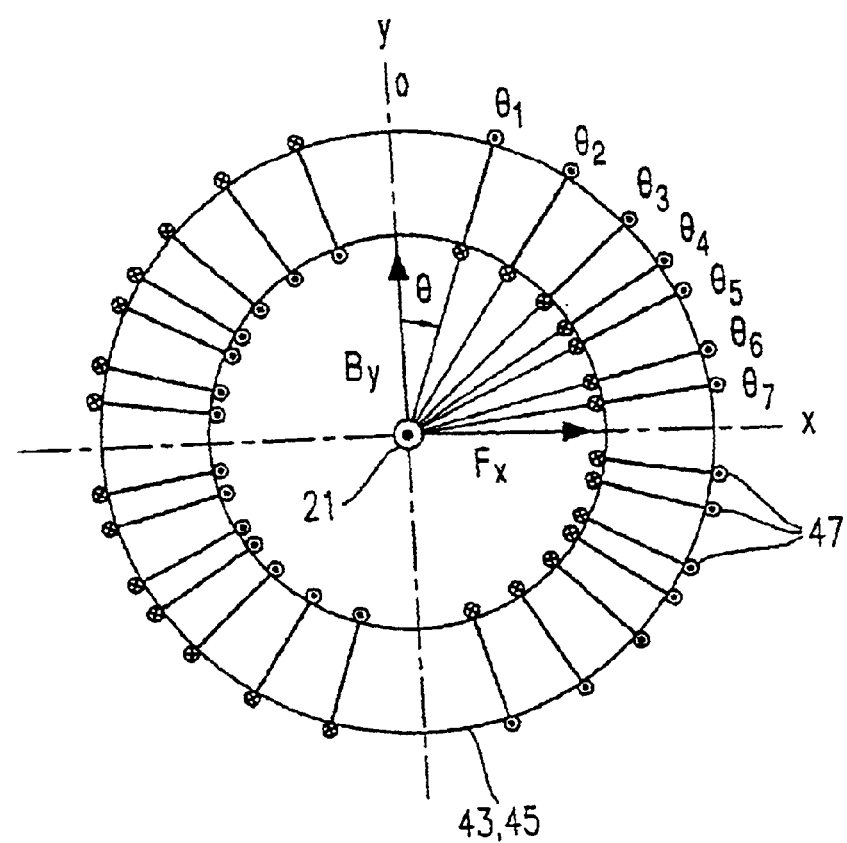
FIG. 4 is a representation of the arrangement of current conductor windings of the deflector shown in FIG. 3.

The deflectors 23, 24 together provide the same displacement M transverse to the z-axis or main axis 21 for both the primary electrons and the secondary electrons. To this end, the structures and functions of both deflectors 23, 24 are symmetric relative to one another and are illustrated in FIGS. 2 to 4.

Figure 2:
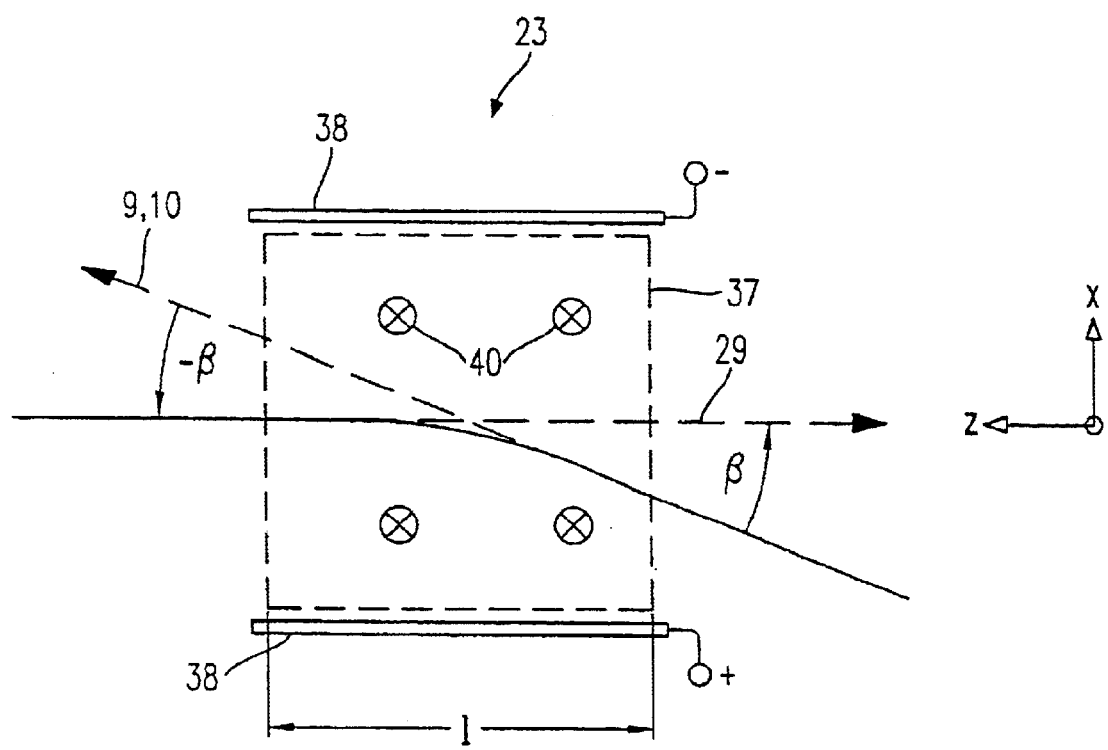
FIG. 2 is a schematic representation illustrating the function of an embodiment of a deflector according to the invention which can also be employed in the examining system of FIG. 1.

In the representation of FIG. 2, the primary electrons 29 enter the deflector 23 from the left and the secondary electrons 9, 10 enter the deflector from the right. In a volume 36, the deflector 23 produces an electric field generated by electrodes 38 as well as a magnetic field designated by reference numeral 40. The directions of the electric field and the magnetic field are orthogonally oriented relative to each other and to the z-direction.

After having passed through the deflectors 22, the direction of movement of the electrons has an angle of β in respect of the direction of movement before entry into the deflector, which angle β is given, in non-relativistic calculation, by the equation:

$$\beta = \frac{e \cdot l(E_x - B_y \cdot V_z)}{mV_z^2}$$

wherein
e indicates the elementary charge
m indicates the electron mass
l indicates the length of the field volume 36 in z-direction
$E_x$ indicates the strength of the electric field
$B_y$ indicates the strength of the magnetic field and
$V_z$ indicates the velocity of the electrons in z-direction.

The deflection angles β and –β for the primary electrons and the secondary electrons are equal to each other when the electric field strength and the magnetic field strength approximately fulfil the following relation:

$$B(E_x) = \frac{V_{z1} - V_{z2}}{V_{z1} \cdot V_{z2}} \cdot E_z,$$

wherein
$V_{z1}$ indicates the velocity of the primary electrons and
$V_{z2}$ indicates the velocity of the secondary electrons.

The above-indicated relation between the electric and magnetic field strengths applies in approximation. If one takes relativistic terms and terms of higher order into consideration which result, for example, when electric or magnetic fringing and stray fields are taken into consideration, deviations from the above may occur.

The relation between the electric and magnetic field strengths being selected in such a way enables the primary electrons and the secondary electrons to be deflected by the deflector 23 through equal, though opposite, angles, and, therefore, the trajectories thereof to coincide.

The deflectors 23, 24 each comprise one or more ferrite rings 43 and ceramic rings 45 of equal diameter which are alternately stacked onto each other centrally in respect of the main axis 21, the ends of the stack, in z-direction, being each formed by a ceramic ring. Each of the ceramic rings disposed at the ends of the stack comprises a plurality of circumferentially distributed bores for current conductor windings 47 to be inserted therethrough. Each current conductor winding 47 extends in parallel to the main axis 21 and engages around a plurality of the ferrite rings 43. A distribution of the current conductor windings 47 in circumferential direction of the rings 43, 45 is evident from FIG. 4. The angles $\theta_1$ to $\theta_7$ resulting in this case have the following values: $\theta_1=21.6°$, $\theta_2=41.6°$, $\theta_3=47.6°$, $\theta_4=62.4°$, $\theta_5=68.4°$, $\theta_6=78.5°$ and $\theta_7=84,5°$. These angles are selected such that the magnetic field generated by the current conductor windings 47 is a substantially homogenous magnetic field oriented in y-direction.

Eight partially cylindrical electrodes 38 are uniformly distributed around the circumference radially inside of the rings 43, 45 and the windings 47, to which electrodes voltages can be applied such that they provide the electric field in the volume which is substantially homogenous and oriented in x-direction.

The beam can also be deflected in y-direction to also deflect the illuminated field on the object slightly in y-direction, as will be described herein below.

The controller 25 adjusts the voltages applied to the electrodes 38 and the currents flowing through the windings 47 such that the electric field produced in the volume 37 and the magnetic field generated therein fulfil the above-specified relation.

Figure 5:
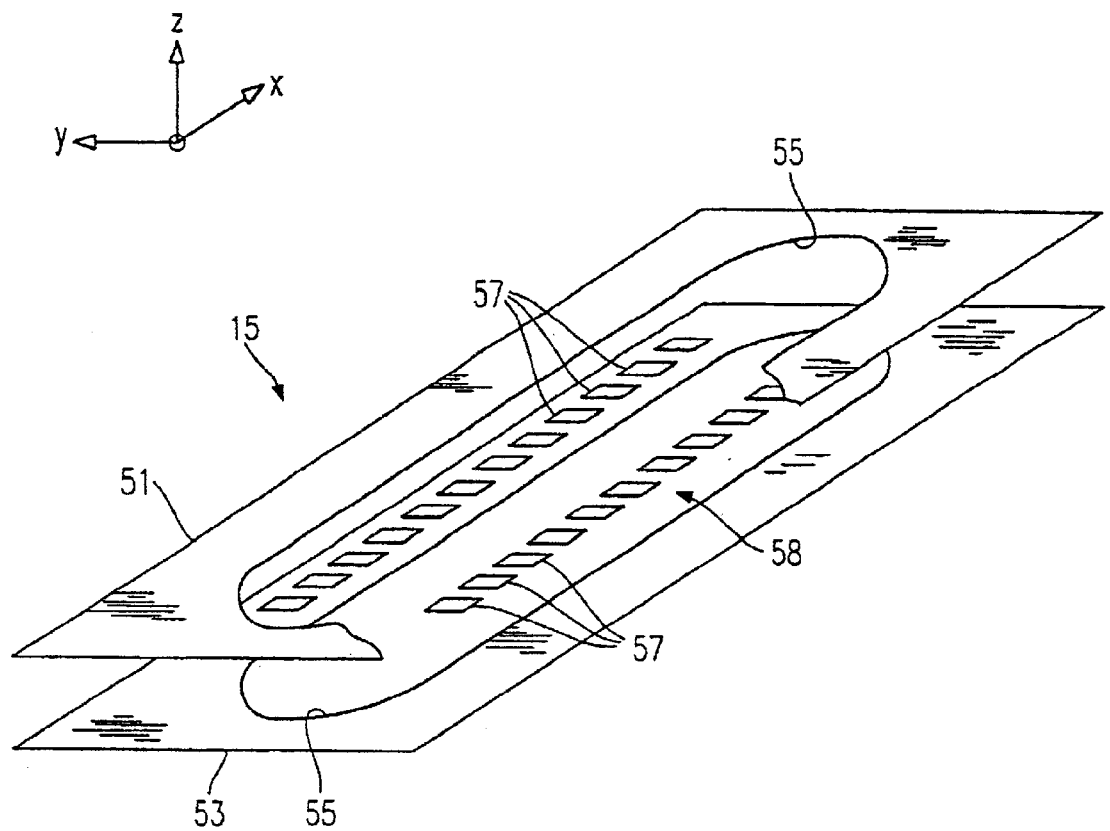
FIG. 5 is an exploded view of a focusing lens employable in the examining system of FIG. 1.
Figures 6A, 6B, 6C:
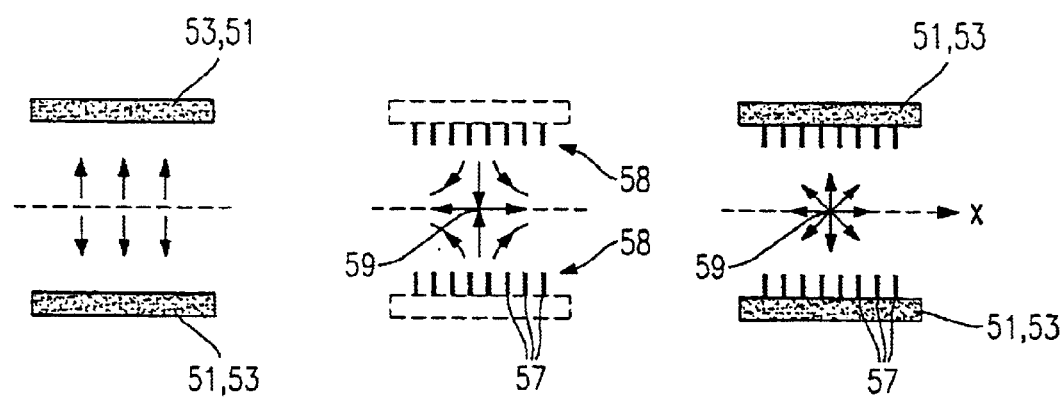
FIGS. 6a–6c show a schematic representation illustrating the focusing lens of FIG. 5.

The focusing lens 15 disposed close to the object is perspectively and schematically represented in FIG. 5. It comprises two planar aperture electrodes 51, 53 which are oriented orthogonally to the z-direction and disposed spaced apart from each other in z-direction. Each of the aperture electrodes 51, 53 is formed with a slit 55 extending in x-direction for the primary electrons and the secondary electrons to pass through. If an electric voltage is applied to the electrodes 51, 53, each of said electrodes produces an electric field, the lines of electric flux of which are schematically represented in FIG. 6a. Such an electric field acts on the electrons traversing the electrodes 51, 53 like a cylindrical lens.

In z-direction between the two electrodes 51, 53, there are disposed two parallel spaced apart rows of finger electrodes 57, said rows extending in x-direction. The primary electrons and the secondary electrons pass through the two rows. The entirety of the finger electrodes 57 defines an electrode arrangement which is referred to hereinafter as comb electrode 58. A separately adjustable voltage can be applied to each finger electrode 57, controlled by the controller 25. A voltage pattern is then applied to the finger electrodes 57 such that the electric field produced by the finger electrodes 57 is of about quadrupole symmetry, as it is shown in FIG. 6b. By appropriately controlling the finger electrodes 57, a main axis 59 of the quadrupole field can be displaced in x-direction by means of the controller 25.

As a result, a superposition of the cylindrical lens field according to FIG. 6a and the quadrupole field according FIG. 6b acts on the electrons traversing the focusing lens 15. This superposition of the electric fields corresponds to a round lens field with an axis of symmetry 59, as it is schematically shown in FIG. 6c.

This means that the lens 15 acts on the electrons traversing the same like a focusing round lens. However, the axis of symmetry 59 of the round lens field is displaceable in x-direction by means of the controller 25.

In operation, the controller 25 applies such a voltage pattern to the finger electrodes 57 that the axis of symmetry 59 of the round lens field is displaced away from the main axis 21 by the same amount M as the center of the field 7 of the object 3 imaged on the detector 5. As a result, the effect of the focusing lens 15 on the secondary electrons emerging from the field 7 is substantially independent of the deflection M of the illuminated field 7. As a result, aberrations which are produced by conventional round lens fields for beam paths extending distant from the axis of symmetry of the round lens field are substantially eliminated.

The lens 15 described with reference to FIGS. 5 and 6 can also be employed in other applications which differ from electron-microscopical applications. These may include any applications wherein a focusing or/and deflecting effect is to be produced on a beam of charged particles including, in particular, ions, an axial center of said focusing effect being displaceable transversely to the beam direction. Such applications embrace, for example, also applications in lithography processes where structures of a mask are transferred to a radiation-sensitive layer by means of charged particles. Furthermore, applications are contemplated, wherein, at several locations spaced apart from each other in slit direction by a sufficient distance, quadrupole fields are produced by the comb aperture such that a focusing effect can be produced at several locations. This enables the lens to simultaneously focus several spaced apart beams of charged particles.

In this case, in particular, equal potentials can be applied to the aperture electrodes 51 and 53 so that the charged particles have the same kinetic energy in z-direction before and after their passage through the lens. However, it is also possible to put the two aperture electrodes 51 and 53 on a different potential so that the particles passing through the lens 15 are accelerated or decelerated by the lens. In both cases, it is possible that the four electrodes have a potential on the average, i.e., except for the quadrupole potential which they provide, that is equal to the potential of the aperture electrode 51 or/and the aperture electrode 53, or that the finger electrodes 57 provide a mean potential which is different from the potential of the aperture electrodes 51 and 53 and which is, as a whole, in particular, higher than the highest of the two aperture electrodes 51, 53 and which can also be lower than the lowest potential of the two aperture electrodes 51, 53.

In the application described with reference to FIG. 1, the lens 15, with its arrangement of aperture electrodes and finger electrodes, is disposed directly in front of the object 3. Here, it is then desirable for the lens 15 to assume, besides its focusing function, also the function of accelerating the secondary electrons emerging from the object 3 and, correspondingly, of decelerating the primary electrons. In such a case, the lens 15 then acts as immersion lens and its aperture electrodes 51 and 53 must be at a different electric potential. Moreover, it is desirable in this respect that there is already a certain potential difference between the object 3 and the aperture electrode 53 facing towards the object, so that the secondary electrons which emerge from the object 3 partly with very low kinetic energy are accelerated already on their way to the lens 15 (sucking-out the secondary electrons). As, here, the electric field which accelerates the at first slowly travelling secondary electrons is, however, provided by the aperture electrode 53 facing towards the object, the cylindrical lens field of the aperture electrode 53 focusing in y-direction has a stronger effect on the at first slowly travelling electrons than subsequently the quadrupole field of the finger electrodes 57 on the then already quicker electrons. Accordingly, in operation of the lens 15 shown in FIG. 5 as immersion lens, the combined effect of the cylindrical lens field and the quadrupole field, namely that these two fields, as a whole, are perceived by the particle beam traversing the lens as round lens, is disturbed.

Figure 7:
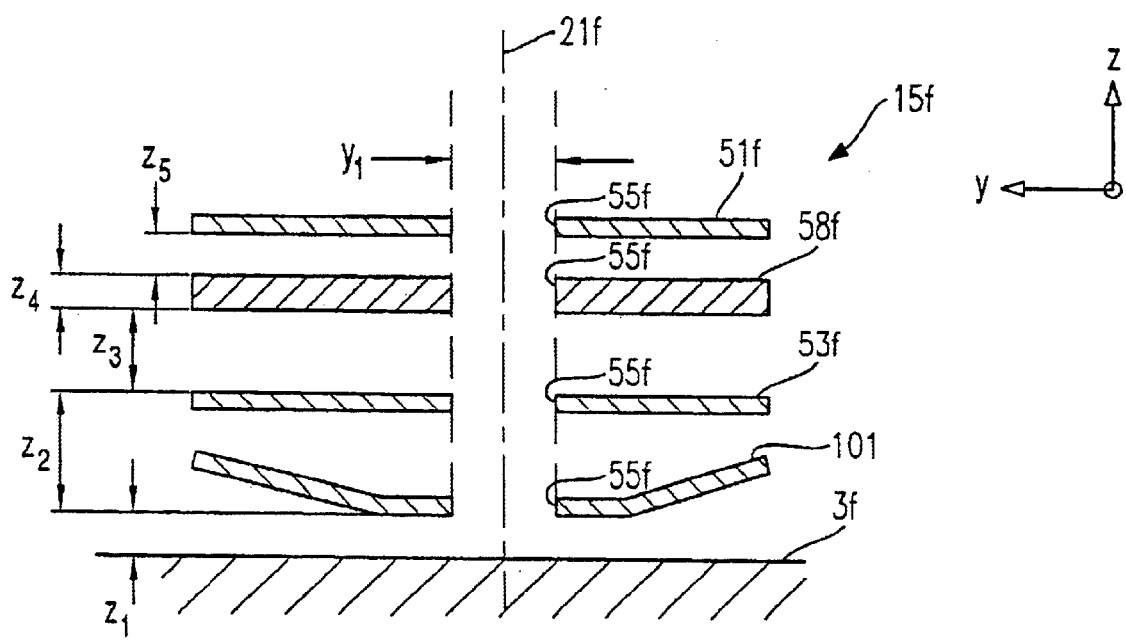
FIG. 7 shows a variant of the focusing lens shown in FIGS. 5 and 6.
Figure 8:
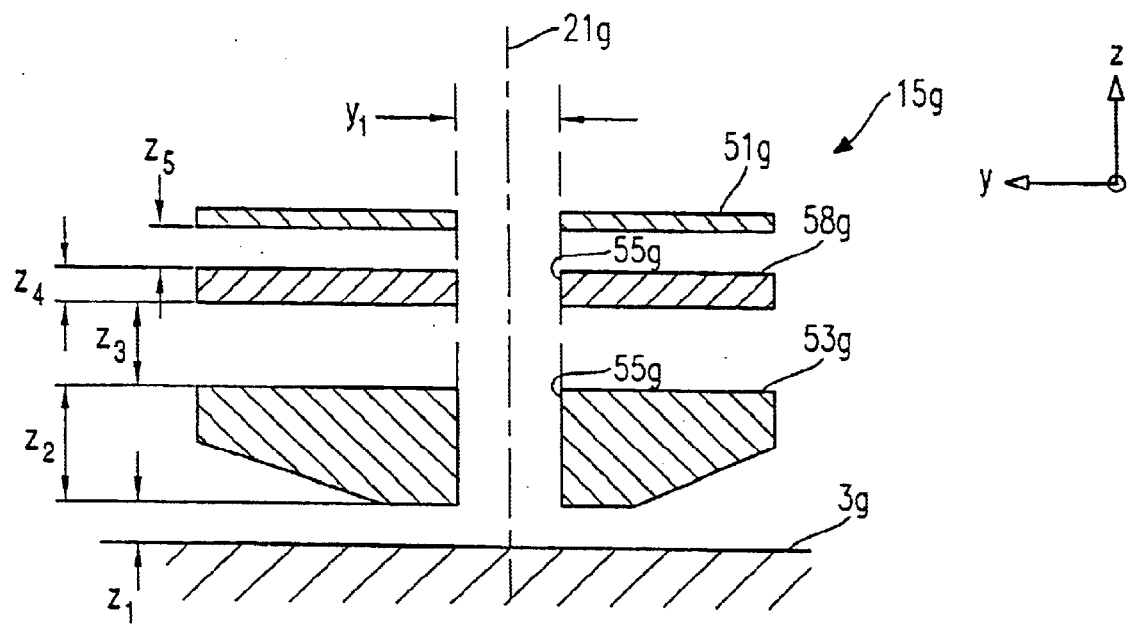
FIG. 8 shows a further variant of the focusing lens shown in FIGS. 5 and 6.

Variants of the focusing device shown in FIG. 5 which take account of this problem, namely to achieve a more precise round lens effect, are schematically shown in cross-section in FIGS. 7 and 8. Those components of the focusing device which correspond in function and structure to the components of FIG. 5 are designated by the same reference numbers as in FIG. 5, for the purpose of distinction, however, supplemented by an additional letter.

A focusing lens 15f shown in FIG. 7 comprises two aperture electrodes 51f and 53f spaced apart from each other in z-direction as well as a comb lens 58f comprising a plurality of finger electrodes, not shown in FIG. 7. Between the aperture electrode 53f disposed close to the object 3f and the object, there is provided a further aperture electrode 101. All electrodes 51f, 58f, 53f and 101 are formed with a centrally disposed, elongated opening or slit 55f for the primary and secondary electrons, respectively, to pass therethrough. In y-direction, i.e., transverse to the direction of extension of the slits 55f, they have a width $y_1$ of, for example, 4 mm. In x-direction, i.e., in the direction of extension of the slits 55f, they have a length of, for example, 50 mm. In an embodiment of such dimensions, the aperture electrode 101 which is disposed close to the object 3 is spaced apart from the object 3f in its region close to the opening by a distance $z_1$ of 2 mm and, in relation to the object 3f, is on an electric potential of 1 kV. The aperture electrode 53f following the aperture electrode 101 in z-direction is spaced apart from the same in its region close to the opening by a distance $Z_2$ of 4 mm and is on an electric potential of 15 kV. The comb lens 58f is spaced apart from the aperture electrode 53f by a clear distance $Z_3$ of 5 mm and is on an electric potential of 20 kV. Its finger electrodes extend in z-direction over a length $Z_4$ of 3 mm. The aperture electrode 51f which is disposed distant from the object 3f is spaced apart from the comb electrode 58f by a clear distance $z_5$ of 4 mm and is on an electric potential of 15 kV. The aperture electrodes 51f, 53f and 101 are each formed of sheet metal having a thickness of 0.5 mm.

Figure 9:
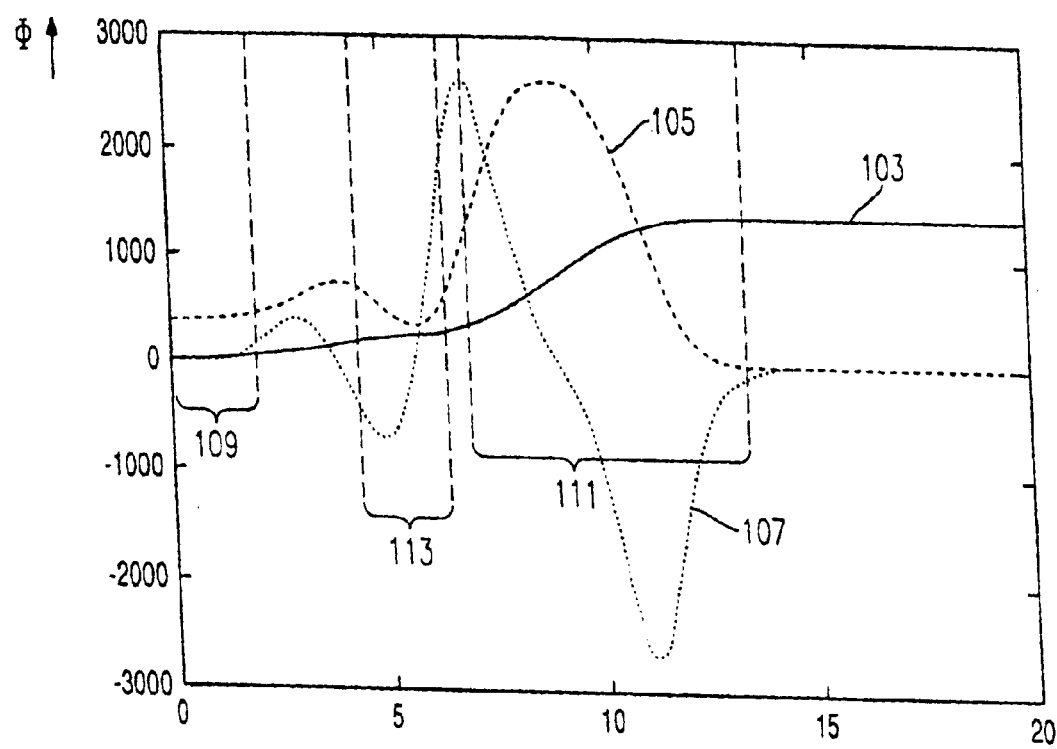
FIG. 9 is a graphical representation of a potential provided by the focusing lens of FIG. 7.

In FIG. 9, the curve 103 shows, in arbitrary coordinates, the course of the electric potential which the lens 15f produces along the z-axis, starting out from the object 3f. Furthermore, FIG. 9 indicates, as curve 105, the first derivative with respect to position of the potential curve 103 and, as curve 107, the second derivative with respect to position of the same. In a region 109, first, the potential increases linearly, so that the emerging secondary electrons are uniformly accelerated. The focusing cylindrical lens field is effective in a region 111 in the center of the lens 15f, which is apparent from the upwardly directed bulge of the first derivative 105 of the potential curve. However, between the regions 109 and 111, a region 113 is provided by the electrodes, wherein the potential curve 103 does not strongly increase and forms a plateau. In this region 113, the first derivative 105 of the potential curve exhibits a downwardly disposed bulge, so that a defocusing cylindrical field acts on the electrons there. This defocusing cylindrical lens field serves to reduce the above-described overall cylindrical lens effect in respect of the quadrupole field providable by the comb aperture 58f, so that the weighting between the overall cylindrical lens effect and the quadrupole lens effect comes close to that of a round lens effect, even in case the lens 15f is operated as immersion lens. In the lens 15f shown in z-direction in FIG. 7, this favourable field curve is due to the spaced apart electrodes 53f and 101.

The structure of a focusing lens 15g shown in FIG. 8 is similar to that of the lens shown in FIG. 7. However, as compared to that, no additional aperture electrode is provided close to the object. Rather, an aperture electrode 53g which is close to a comb lens 58g in z-direction towards an object 3g is not formed of thin sheet metal, but is of trapezoidal shape of increased thickness on both sides of an opening 55g as shown in cross-section in FIG. 8. In a possible configuration of the embodiment of the lens 15g, the dimensions $z_1$, $Z_2$, $Z_3$, $Z_4$, $Z_5$ and $y_1$ are equal to the corresponding dimensions of FIG. 7. Here, the aperture electrode 53g which is close to the object 3g is on a potential 1 kV, the comb lens 58g is on a medium potential of 20 kV and an aperture electrode 51g which is distant from the object 3g is on a potential 15 kV.

With the aperture electrode 53g which is increased in thickness and disposed close to the object, a similar defocusing cylindrical lens field can be provided as by the two electrodes 101 and 53f of the embodiment shown in FIG. 7.

Figure 10:
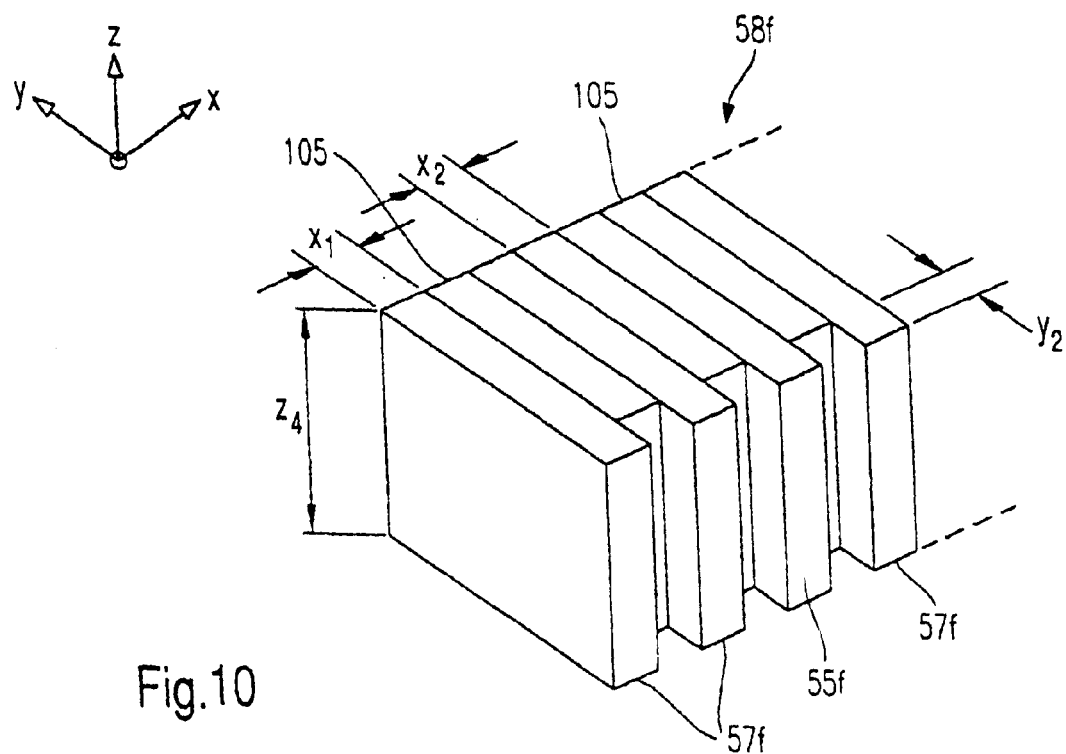
FIG. 10 is a detailed representation of the focusing lens of FIG. 7.

FIG. 10 is a detailed view of the comb aperture 58f employed in the embodiment of FIG. 7. Finger electrodes 57f are provided as identical plates which are juxtapositioned in x-direction, with adjacent finger electrodes 57f being separated by plates 105 of ceramic insulating material 105. The electrode plates 57f have a thickness $x_1$ of 1 mm, while the insulating plates 105 each have a thickness $x_2$ of 0.5 mm. The finger electrode plates 57f as well as the insulating plates 105 extend in z-direction over a height $Z_4$ of 4 mm. In a direction extending towards the opening 55f, the electrode plates 57f project, relative to the insulating plates 105, into the opening 55f by a distance $Y_2$ of 2.5 mm.

Figure 11:
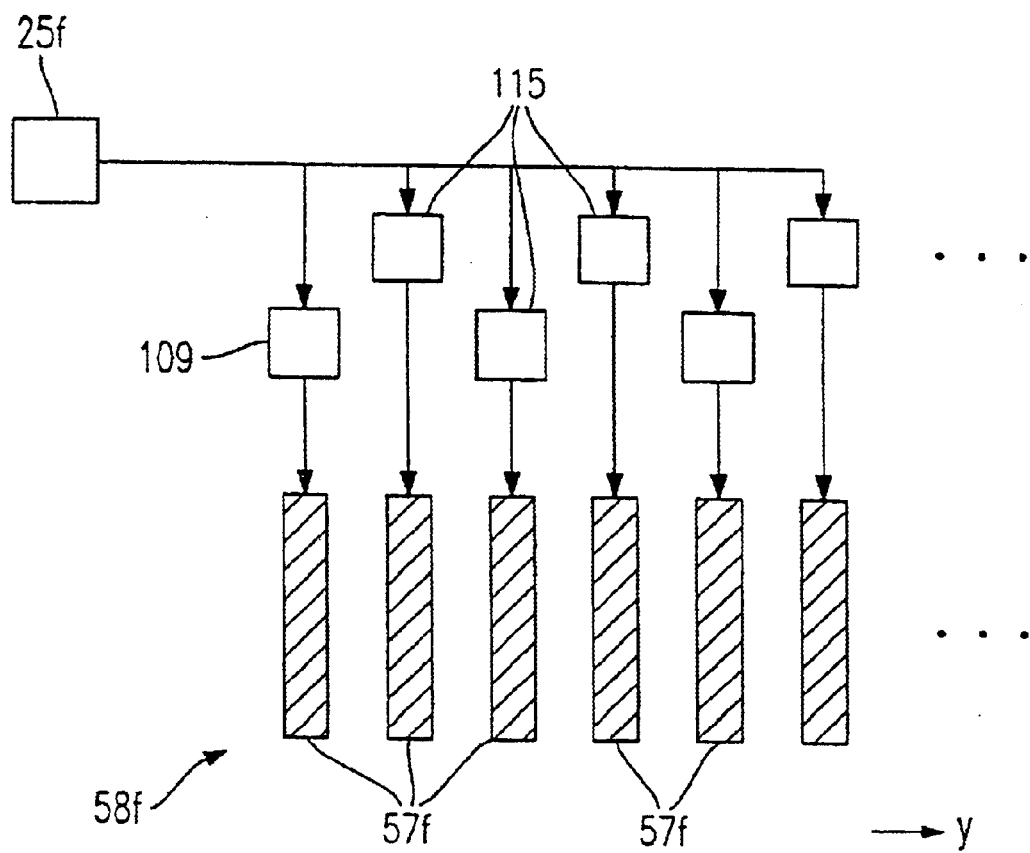
FIG. 11 shows a control scheme for the focusing lens of FIG. 7.

FIG. 11 illustrates how different potentials can be applied to the finger electrodes of the embodiment shown in FIGS. 7 and 8, in order for the comb apertures to produce the quadrupole field.

In the embodiment of FIG. 11, a separate driver 109 is allocated to each finger electrode 57f to apply a desired voltage to the respective finger electrode 57f. The individual drivers 109, in turn, are controlled by a higher-ranking focusing lens controller 25f to displace the voltage pattern generated by the drivers 109 in x-direction when, in operation of the lens 15f, the round lens effect is to be displaced. In particular, by constantly changing the voltages applied to the finger electrodes, this displacement of the quadrupole field in x-direction is likewise constantly possible. Moreover, the displacement can also be effected, step-by-sep, in that, for example, an invariable voltage pattern applied to the finger electrodes is switched from one finger electrode group to a further finger electrode group.

As an alternative to the embodiment of the focusing lens described with reference to FIGS. 5 to 11, the variable axis lens originating from E. Goto can be employed, as it has already been described above.

Due to the different kinetic energies or velocities of the primary electrons and secondary electrons, it is possible that equal deflection angles β or deflections M away from the main axis are provided by the deflectors 23, 24 for both types of electrons. However, the focusing lens 15 and also the focusing lens 17 exhibit for both types of electrons different focusing effects and different focal lengths, respectively, due to the differences in the kinetic energy of the electrons. Here, the focusing lenses 15 and 17 are then adapted such that they are optimized in respect of a focusing effect for the secondary electrons in order to obtain a maximum resolution of the optical image of the field 7 on the detector 5. This adaptation of the focusing lenses 15 and 17 is then not optimal for the primary electrons for the illumination of the field 7. However, this can be tolerated, because, in order to merely illuminate the field 7, it is not necessary to precisely image, for example, the aperture 35 in the plane of the object 3.

With the examining system 1, a two-dimensional image of structures of the object 3 can be obtained as follows. The maximum deflection M of the field away from the main axis 21 is limited by the length of the slit 55 in x-direction and by the maximum beam displacement which is attainable by the deflectors. First, the deflectors 23, 24 and the focusing lens 15 are adjusted by the controller such that the field 7 deflected at a maximum in (−x)-direction is imaged on the detector 5. The detector 5 is illuminated by secondary electrons until an image of sufficient contrast can be read out which is stored. Subsequently, the deflection M is reduced by a value which corresponds to the extension of the field 7 in x-direction, and a new image of the secondary electrons is obtained by the detector which is likewise stored. This procedure is repeated, step-by-step, until the field 7 is disposed at its maximum deflection in (+x)-direction. Then, the object 3 is mechanically displaced in y-direction relative to the examining system by means of a drive, which is not shown in the Figures, namely by a distance which corresponds to the extension of the field 7 in y-direction. Subsequently, images are again picked up with the camera 5 with the respectively different deflections M. If the entire surface of the object has been scanned in this way, the images are combined to obtain the two-dimensional image of the structures of the object.

It is also possible to configure the deflectors 23, 24 such that they are able to deflect the field 7, besides in x-direction, also in y-direction. Here, the maximum deflection in y-direction is smaller than the maximum deflection in x-direction, namely such that, with the relatively small deflections in y-direction, an image of the illuminated field 7 of sufficient quality is obtained on the detector. It is then possible to mechanically displace the object 3 continuously in y-direction relative to the examining system and to "carry" the illuminated field "along" with the moved object in y-direction corresponding to the mechanical displacement of the object 3 relative to the examining system.

With a primary electron flow of 3.2 $\mu$A and a dimension of the field 7 in the plane of the object of 100 $\mu$m×100 $\mu$m, a flow of about 2.6 $\mu$A of secondary electrons can be produced. If the camera has a resolution of 1000×1000 pixels, a resolution of the examining system of 100 nm is obtained. If about 2000 electrons are to impinge on each pixel of the camera, the examining system is capable of scanning 0.2 $cm^2$/sec or 720 $cm^2$/h of the object surface.

In the following, variants of the invention are described. Components which correspond in function and structure to those of the embodiments illustrated in FIGS. 1 to 11 are designated by the same reference numbers as in FIGS. 1 to 11, for the purpose of distinction, however, supplemented by an additional letter.

Figure 12:
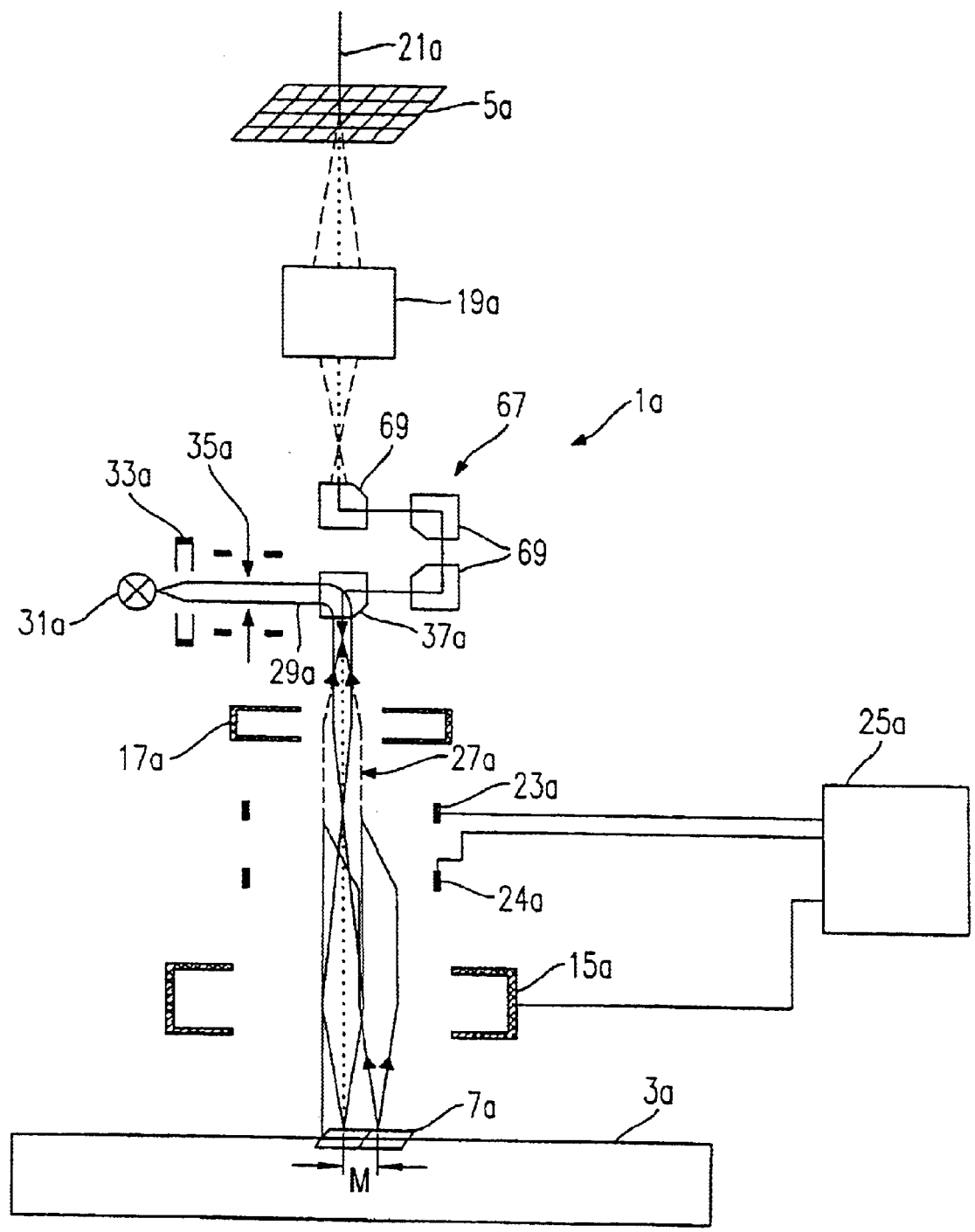
FIG. 12 is a schematic representation of a further embodiment of the examining system according to the invention, wherein backscattering electrons are observed.

An examining system 1a schematically shown in FIG. 12 serves to image backscattering electrons, which emerge in a field 7a from an object 3a to be examined, on a position-sensitive detector 5a. As in the above-described embodiment, the field 7a imaged on the detector 5a is also deflectable from a main axis 21a (deflection M).

As backscattering electrons have a considerably higher kinetic energy than secondary electrons, a separate electrode for accelerating the backscattering electrons (see electrode 13 in FIG. 1) is not necessarily required. However, if required, a corresponding electrode may also be provided in order to increase the kinetic energy of the backscattering electrons.

After emerging from the surface of the object 3a, first, the backscattering electrons pass through a focusing lens 15a disposed close to the object, subsequently, through two deflectors 24a, 23a, the deflection angle of which is set such that the backscattering electrons emerging from the field 7a pass through a fixed beam cross-section 27a irrespective of the deflection M of the field 7a. After having passed through the fixed beam cross-section 27a, the backscattering electrons pass through a further focusing lens 17a and a beam divider or beam combiner 37a which serves to superimpose the beam of backscattering electrons to the beam of primary electrons 29a, the latter being shaped by an electron gun 31a, a focusing lens 33a and an aperture 35a.

The flow of the primary electrons is, for example, 10 $\mu$A and the kinetic energy is, for example, 10 keV.

After having passed through the beam combiner 37a, the primary electrons successively pass through the focusing lens 17a, the two deflectors 23a, 24a and the focusing lens 15a. Here, the deflectors 23a and 24a are again set such that they provide such a deflection M also for the primary electrons, so that the region illuminated by the primary electrons on the object 3a substantially coincides with the field 7a imaged on the detector 5a.

As the backscattering electrons have a relatively wide energy distribution, an image-preserving energy filter 67 is provided between the beam combiner 37a and a further optical magnification system 19a, in order to select from the backscattering electrons electrons of a smaller energy spectrum which are then magnified by means of the optical system 19a and imaged on the detector 5a. The energy filter 67 comprises several sector magnets 69 and is configured such that the geometrical imaging of the field 7a on the detector 5a is not disturbed by the filter 67. An example of such an energy filter 67 is described in European patent no. 0 218 920 B1 of the applicant. The full disclosure of this document is incorporated in this application by reference.

The structure of the focusing lens 15a disposed close to the object 3a can be the same as in the embodiment described above with reference to FIGS. 5 to 11. However, it is also possible to employ for this purpose a variable axis lens originating from E. Goto.

Figure 13:
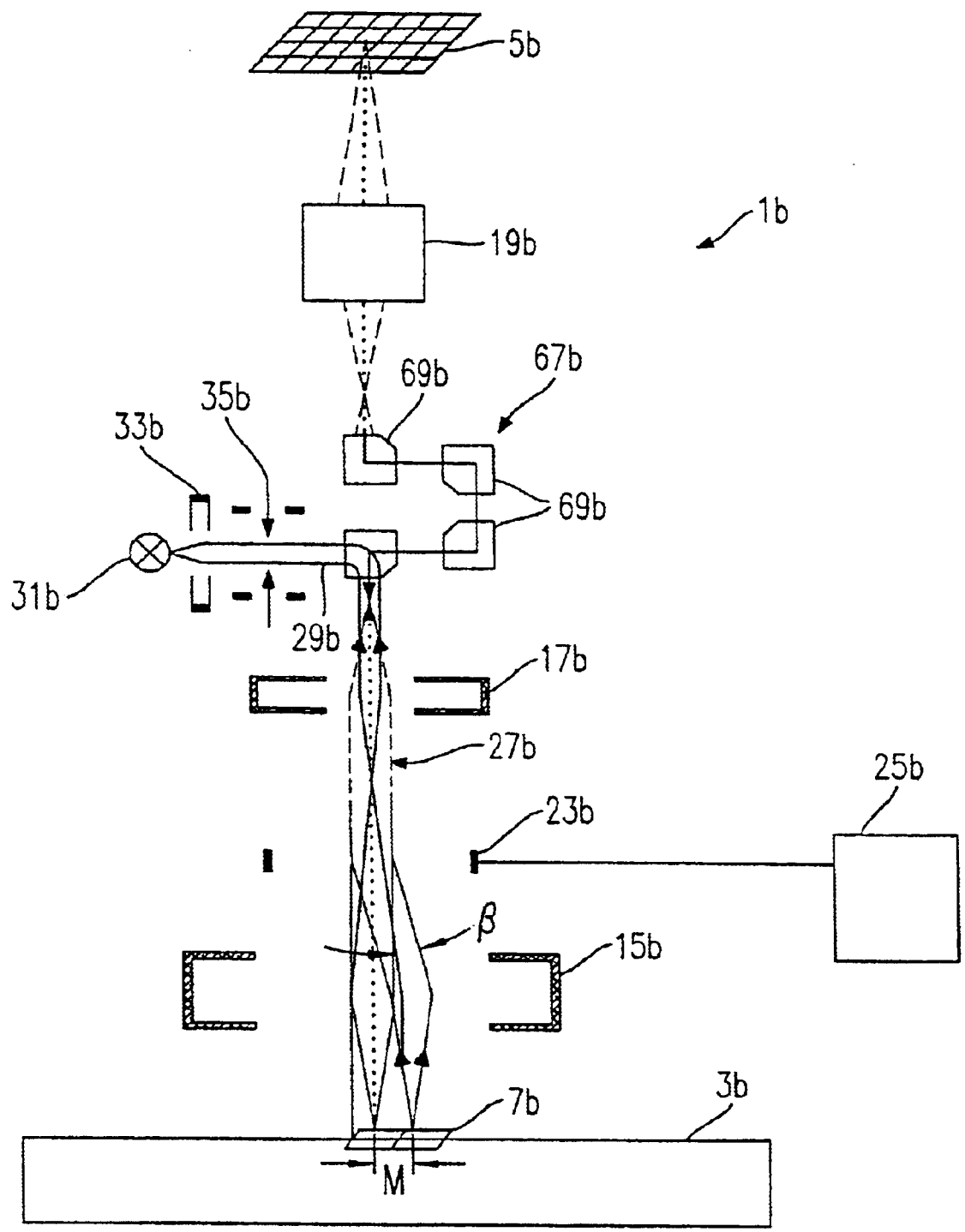
FIG. 13 is a schematic representation of a variant of the embodiment shown in FIG. 12.

An examining system 1b schematically depicted in FIG. 13 is substantially similar in structure as the examining system shown in FIG. 12. It likewise serves to image backscattering electrons on a detector 5b, said backscattering electrons emerging from a field 7b which is displaceable in the plane of the object 3b. However, in contrast to the embodiment shown in FIG. 12, here, not two separate deflectors are provided to cause the variable deflection M of the field 7b to be imaged. Rather, merely one deflector 23b is provided, the function of the second deflector being assumed by a focusing lens 15b disposed close to the object 3b. A structure of the focusing lens 15b which is suitable for this purpose is disclosed in German patent application no. 196 34 456 A1 and comprises an electric or magnetic cylindrical lens field having superposed to it a stationary electric or magnetic quadrupole field.

Figure 14:
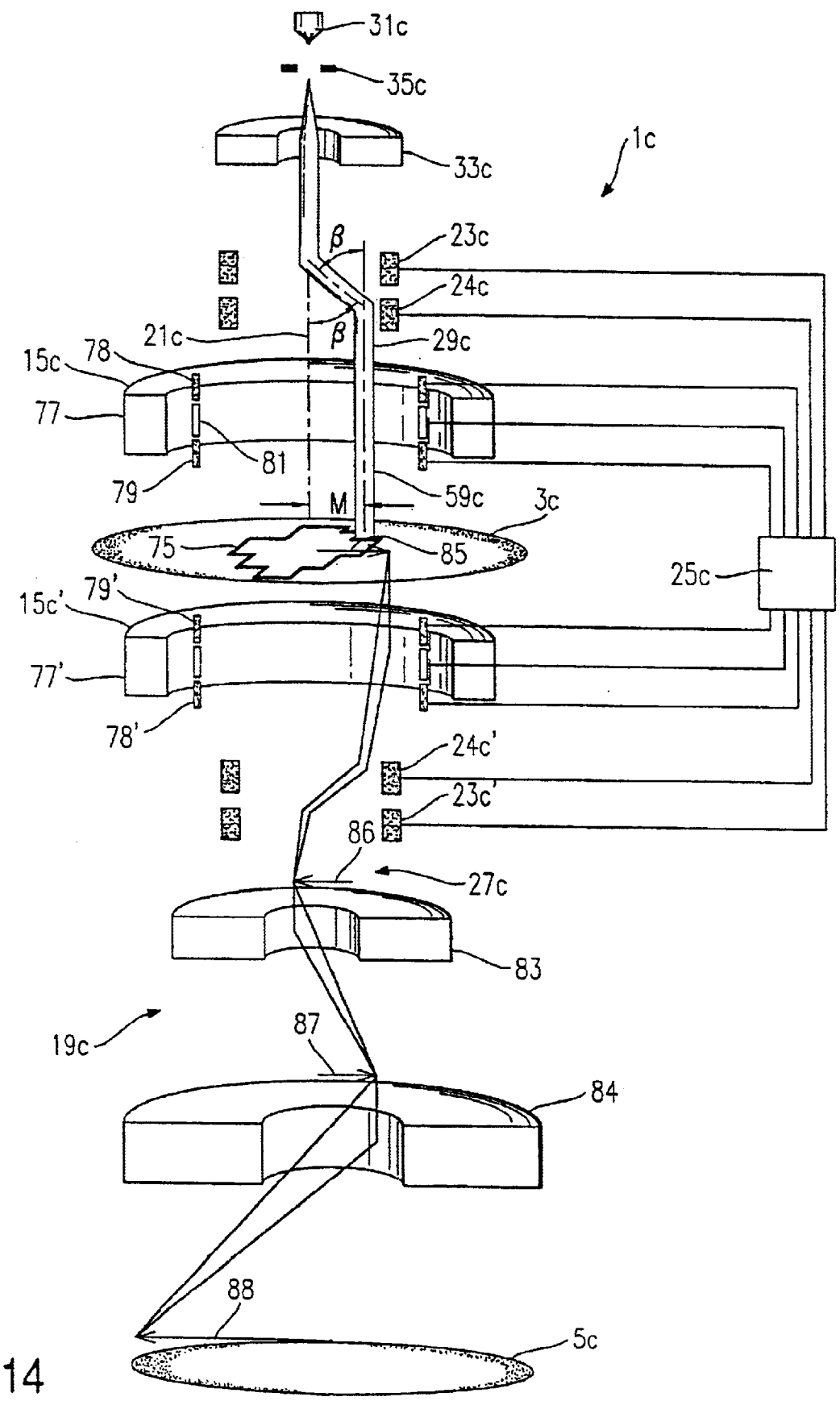
FIG. 14 is a schematic representation of a further embodiment of the examining system according to the invention, wherein transmission electrons are observed.

An examining system 1c schematically shown in FIG. 14 serves to obverse transmission electrons on a detector 5c, which transmission electrons emerge from a field in the plane of an object 3c. The object 3c is a lithographic mask for imaging a structure 75 on a wafer in a lithography process. The field imaged on the detector 5c by means of transmission electrons is displaceable in the plane of the object (deflection M).

In order to shape a beam of primary electrons 29c which serves to illuminate the field, to be imaged on the detector 5c, in the object plane, an electron gun 31c, an aperture 35c and a focusing lens 33c are provided. After having passed through the focusing lens 33c, the primary electron beam successively passes through deflectors 23c and 24c which are spaced apart from each other and deflect the beam through equal opposite angles β to cause the deflection M. The primary electron beam 29c is then focused by a focusing lens 15c onto the object 3c to illuminate there the field to be imaged. The focusing lens 15c is a lens with variable optical axis which originates from E. Goto. To this end, it comprises a round lens 77 for providing a focusing magnetic field which is rotationally symmetric in respect of a main axis 21c and coils 78, 79 for producing a magnetic dipole field. The current flowing through the dipole coils 78, 79 is adjustable by a controller 25c such that the superposition of the stationary round lens field and the dipole fields produce the effect of a round lens field, the axis of symmetry 59c of which is likewise displaced from the main axis 21c by an amount M. In FIG. 14, reference number 81 designates a dynamic focusing coil which is likewise controlled by the controller 25c to optimise the effect of the focusing lens 15c at different deflections M.

In order to return the transmission electrons traversing the object 3c to the main axis 21c or a fixed beam cross-section designated by 27c in FIG. 14, when the field is deflected, said beam cross-section being independent of the deflection M, a beam guidance is provided for the transmission electrons which includes components which are structured symmetrically to the beam guidance components for deflecting the primary electrons. The components for guiding the beam of transmission electrons are designated by the same reference numbers as the corresponding components for guiding the beam of primary electrons, but supplemented by an additional '. Said beam guidance thus comprises a variable axis focusing lens 15c' disposed close to the object and two deflectors 24c' and 23c'.

Downstream of the deflection-independent beam cross-section 27c, there are provided in the beam path a further optical magnification system 19c with two round lenses 83, 84, before the transmission electrons impinge on the detector 5c.

It is apparent from the beam path for the transmission electrons shown in FIG. 14 how an object size 85 is imaged, via intermediate images 86, 97, to an image 88 on the detector 5c.

As an alternative to the focusing lenses 15c and 15c', respectively, with variable optical axis which are disposed close to the object 3a, one or both of these lenses can be replaced by a lens as it is described above with reference to FIGS. 5 to 13.

Figure 15:
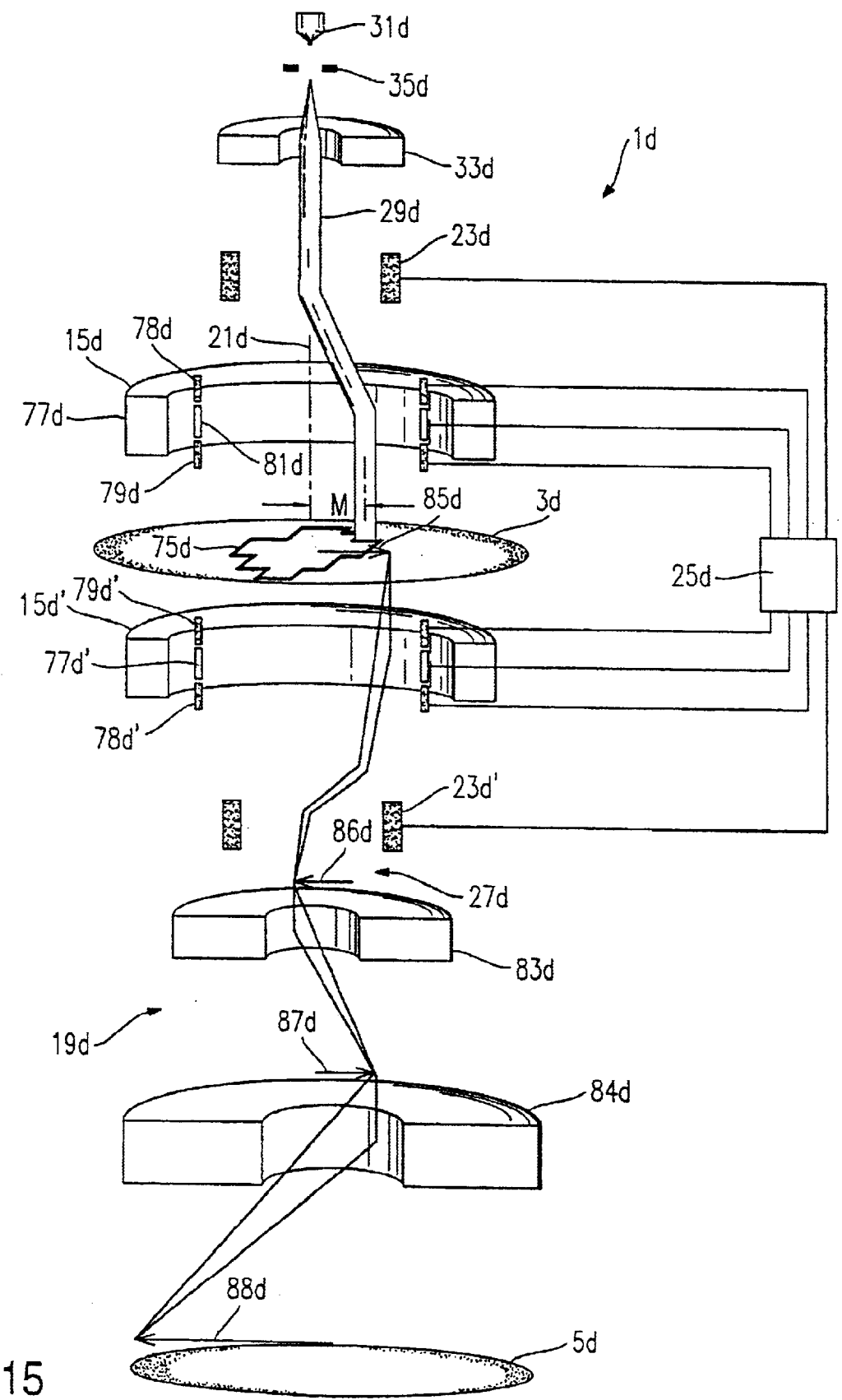
FIG. 15 is a schematic representation of a variant of the examining system shown in FIG. 14.

FIG. 15 schematically shows an examining system 1d which is similar in structure to that shown in FIG. 14. It serves to image a field disposed in the object plane 3d on a detector 5d, said field being displaceable in respect of a main axis 21d. In contrast to the two separate deflectors provided in the embodiment according to FIG. 14 for causing the deflection of a primary beam 29d from the main axis 21d, here, merely one separate deflector 23d is provided and the function of the second deflector is provided by a focusing lens 15d disposed close to the object 3d. As regards its components, the beam path provided for returning the transmission electrons to the main axis 21d or towards a beam cross-section 27d, which is independent of the deflection M, is symmetric to the beam guidance for the primary electrons, and the components provided for this purpose, namely the focusing lens 15d' and the deflector 23d' are designated by corresponding reference numbers, but supplemented by an additional '.

Figure 16:
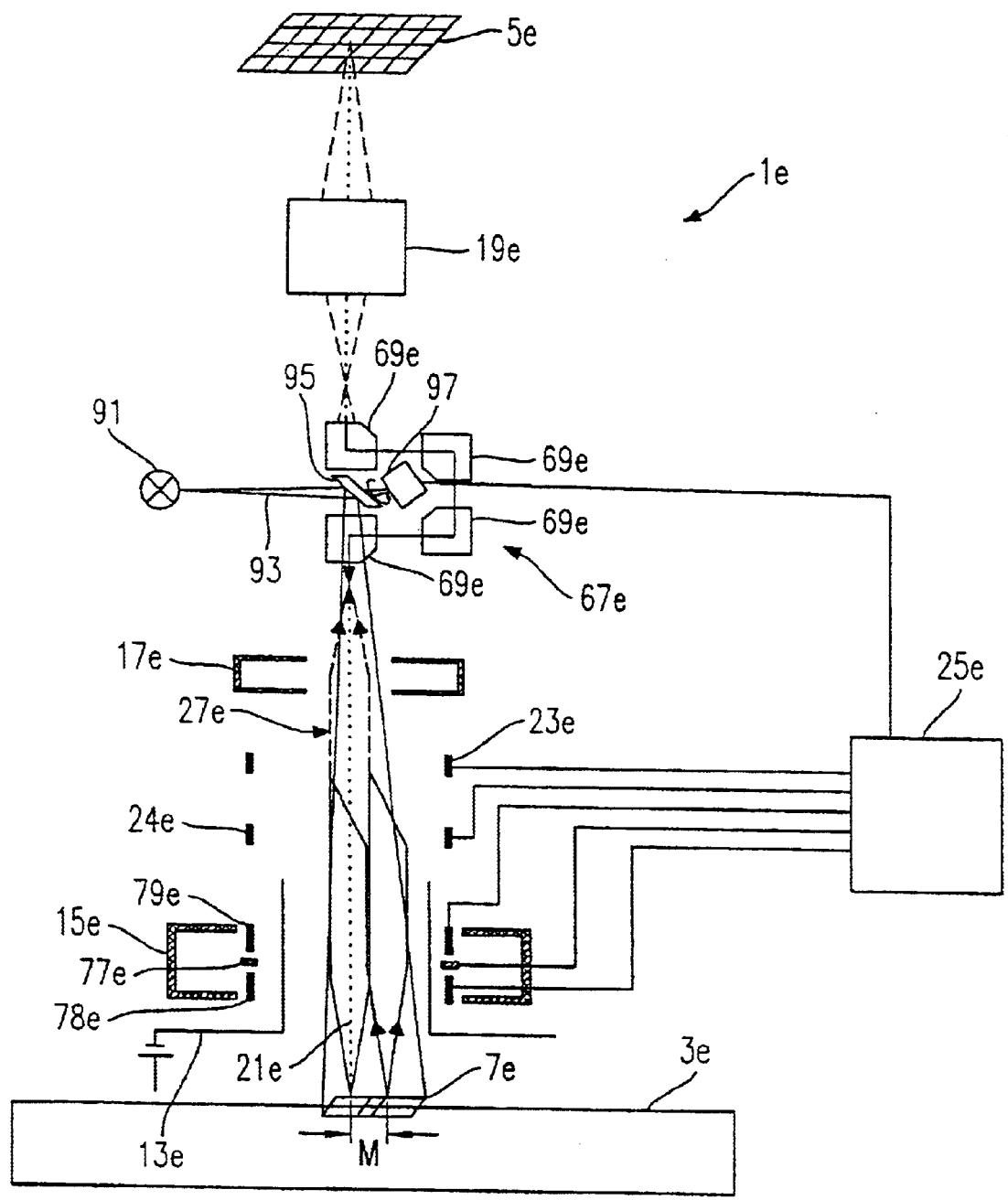
FIG. 16 is a schematic representation of a further embodiment of the examining system according to the invention, wherein photoelectrons are observed.

An examining system 1e schematically shown in FIG. 16 serves to image photoelectrons on a detector 5e, said photoelectrons emerging from a two-dimensionally delimited field 7e on the surface of an object 3e to be examined. The field 7e to be imaged is deflectable in respect of a main axis 21e and a fixed beam cross-section 27e, respectively. The electron-optical system for guiding the photoelectrons emerging from the object 3e towards the detector 5e is similar in structure to the system for guiding the backscattering electrons to the detector described with reference to the embodiment shown in FIG. 7. However, an electrode 13e is provided to accelerate the photoelectrons after having emerged from the object 3e.

The deflection M is caused by two deflectors 23e and 24e which are disposed spaced apart from each other in the direction of the main axis 21a, and a focusing lens 15e disposed close to the object is provided as variable axis lens and comprises dipole coils 78e and 79e as well as, in addition, dynamic focusing coils 77e controlled dependent upon the deflection M.

Furthermore, an image-preserving energy filter 67e is provided to delimit the energy spectrum of the photoelectrons which are supplied to a further optical magnification system 19e. The energy filter 67e comprises several sector magnets, the photoelectrons being deflected from the main axis 21a by the sector magnet 69e of the energy filter 67e which they enter first.

The illumination of the field 7e to be imaged by means of photons for generating the photoelectrons is effected by means of a light source 91 producing a light beam 93 which is directed to a deflecting mirror 95 disposed on the main axis 21e. The deflecting mirror 95 is disposed at a location on the main axis 21e where the beam of photoelectrons has already been deflected away from the mean axis 21a by the first sector magnet 69e.

The deflecting mirror 95 is pivotal by means of a drive 97 controlled by the controller 25e. The controller 25e controls the movement of the deflecting mirror 95 dependent upon the deflection M of the field 7e imaged on the detector 5e such that the imaged field 7e is always illuminated with photons of the light source 91. The region in the plane of the object 3e illuminated with photons corresponds, as regards its geometry, substantially to the field 7e which is electron-optically imaged on the detector 5e.

As an alternative to the configuration of the focusing lens 15e disposed close to the object 3e as variable axis lens, it is also possible to employ a lens as focusing lens 15e as it is described with reference to FIGS. 5 to 11.

Moreover, it is also possible, in order to cause the deflection, not to provide two separate, successively disposed deflectors 23e and 24e, but merely one separate deflector and to provide the function of the second deflector by the focusing lens 15e, as it is reflected by the embodiment described with reference to FIG. 8.

In the above-described embodiments, wherein secondary electrons and backscattering electrons are imaged on the detector, the deflector is traversed by primary electrons as well as by secondary or backscattering electrons. This is very exacting for the deflector, because substantially the same deflection is to be imposed on the primary electrons as well as on the secondary or backscattering electrons. In the embodiments wherein transmission electrons and photoelectrons are imaged on the detector, however, the demands on the deflector device are not as high, because merely the electrons travelling from the object to the detector are to be deflected in defined manner. In this case, deflectors may also be employed which merely provide a variable electric field or a variable magnetic field.

In the above-described embodiments which operate with photoelectrons, a pivotal mirror was employed to displace the field illuminated with photons in the object plane. As an alternative to this, other measures can also be employed to variably displace the photons. One example for this is an acousto-optical modulator.

With reference to FIGS. 5 to 11, embodiments of the first focusing lens have been described which operate as particle-optical focusing device with a comb aperture. Irrespective of the use of this focusing device in the above-described examining system, modifications thereof are also contemplated. For example, it is also provided for that the aperture disposed closest to the object, which has been described above as simple slit aperture, is provided as comb aperture so that the potential curve of the focusing device can be additionally influenced via this comb aperture and, in addition, this influence can be effected in displaceable manner along the slit direction. It is also possible to provide one or even both of the apertures 51 and 53 adjacent to the comb aperture 58 in FIG. 2 also as comb aperture.

We claim:

1. An examining system for imaging an object which is positionable in an object plane, comprising:
   an illumination device for supplying energy to a delimited field of the object such that charged particles emerge from locations of the delimited field, the delimited field being displaceable in the plane of the object;
   a first deflector for providing a variable deflection field for guiding charged particles emerging from locations of a selectable region of the object;
   a position-sensitive detector disposed in a beam path such that the charged particles, after having passed through the first deflector impinge on the position-sensitive detector, wherein particles emerging from different locations of the selectable region of the object are imaged on different locations of the position-sensitive detector which are allocated to the locations of emergence; and
   a controller for controlling the illumination device to change the displacement of the delimited field and for controlling the first deflector such that the selectable region of the object imaged on the detector is displaced together with the illuminated field in the object plane.

2. The examining system according to claim 1, wherein the delimited field substantially coincides with the selectable region of the object imaged on the detector.

3. The examining system according to claim 1, further comprising a first focusing lens device disposed between the object and a region of stationary beam cross-section for providing a deflection field which acts on the particles emerging from the locations of the selectable region of the object imaged on the detector like a focusing lens.

4. The examining system according to claim 3, wherein the deflection field is variable and the controller is furthermore provided for controlling the first focusing lens device such that an optical axis of the focusing lens is displaceable transversely to the axial direction thereof.

5. The examining system according to claim 4, wherein the controller is furthermore provided for controlling the first focusing lens device such that the optical axis thereof intersects the imaged region of the object substantially centrally irrespective of the displacement of the imaged region of the object.

6. The examining system according to claim 3, wherein the first focusing lens device is a particle-optical focusing device for providing deflection fields having a focusing effect on a beam of charged particles, comprising:
   a plurality of aperture structures which are electrically insulated and spaced apart from one another in a direction (z) of the beam, each of said aperture structures comprising a region with a continuous opening for a free beam traversal,
   each of said openings having a length and a width, the length extending in a first direction (x) transverse to the beam direction and the width extending in a second direction (y) oriented transversely to the first direction and transversely to the beam direction, the length being larger than the width,
   and wherein at least one aperture structure disposed between two aperture structures positioned adjacent to each other in the beam direction is provided as a comb aperture structure which comprises on each side of the opening of the comb aperture structure, as seen in the first direction (x), a plurality of electrodes which are electrically insulated and disposed spaced apart from one another.

7. The examining system according to claim 6, wherein a first aperture structure which is different from the comb aperture structure comprises at least one electrode region extending in a region of the opening of the first aperture structure in the beam direction over a distance which is larger than 0.25 times the width of the opening of the first aperture structure in this region.

8. The examining system according to claim 6, wherein a second aperture structure and a third aperture structure are provided which are each different from the comb aperture structure and which are disposed spaced apart from one another in the beam direction and directly adjacent to one another, each of said second and third aperture structures comprising at least one electrode region in a region of the openings of the second and third aperture structures, said electrode regions being disposed spaced apart from one another in the beam direction by a distance which is larger than 0.5 times a common width of the openings of the second and third aperture structures.

9. The examining system according to claim 6, wherein the particle-optical focusing device further comprises a deflection field controller for applying electric potentials to multiple electrodes of the comb aperture structure such that the multiple electrodes produce approximately a quadrupole field, the axis of symmetry of which extending substantially in a beam direction within the opening of the comb aperture structure.

10. The examining system according to claim 9, wherein the deflection field controller is provided to apply the electric potentials such that the axis of symmetry can be positioned at several selectable locations which are offset from each other in the first direction.

11. The examining system according to claim 10, wherein the axis of symmetry is substantially continuously displaceable in the first direction (x).

12. The examining system according to claim 9, wherein the deflection field controller is provided to adjust a mean electric potential of at least two aperture structures relative to each other.

13. The examining system according to claim 9, wherein selectable electric potentials are supplyable to the electrodes of the comb aperture structure by means of the deflection field controller.

14. The examining system according to claim 6, wherein the electrodes of the comb aperture structure have a dimension in the beam direction which is about 0.5 times to 1.5 times the width of the opening of the comb aperture structure in the region of the electrodes.

15. The examining system according to claim 3, wherein the first focusing lens device is a particle-optical focusing device for providing deflection fields having a focusing effect on a beam of charged particles, comprising:
    a first aperture structure comprising a region with a continuous opening for a free beam traversal, said opening having a length and a width, the length extending in a first direction (x) transverse to the beam direction and the width extending in a second direction (y) oriented transversely to the first direction and transversely to the beam direction, the length being larger than the width; and
    a comb aperture structure electrically insulated and spaced apart from the first aperture structure in a direction (z) of the beam, the comb aperture structure comprising an opening, wherein the comb aperture structure comprises on each side of the opening of the comb aperture structure, as seen in the first direction (x), a plurality of electrodes which are electrically insulated and disposed spaced apart from one another.

16. The examining system according to claim 15, wherein the first aperture structure comprises at least one electrode region extending in a region of the opening of the first aperture structure in the beam direction over a distance which is larger than 0.25 times the width of the opening of the first aperture structure in this region.

17. The examining system according to claim 15, wherein the particle-optical focusing device further comprises a deflection field controller for applying electric potentials to multiple electrodes of the comb aperture structure such that the multiple electrodes produce approximately a quadrupole field, the axis of symmetry of which extending substantially in a beam direction within the opening of the comb aperture structure.

18. The examining system according to claim 17, wherein the deflection field controller is provided to apply the electric potentials such that the axis of symmetry can be positioned at several selectable locations which are offset from each other in the first direction.

19. The examining system according to claim 18, wherein the axis of symmetry is substantially continuously displaceable in the first direction (x).

20. The examining system according to claim 17, wherein the deflection field controller is provided to adjust a mean electric potential of the first aperture structure and the comb aperture structure relative to each other.

21. The examining system according to claim 15, wherein the electrodes of the comb aperture structure have a dimension in the beam direction which is about 0.5 times to 1.5 times the width of the opening of the comb aperture structure in the region of the electrodes.

22. The examining system according to claim 15, wherein selectable electric potentials are supplyable to the electrodes of the comb aperture structure by means of the deflection field controller.

23. The examining system according to claim 1, wherein the illumination device comprises a photon source to illuminate the delimited field, wherein the charged particles emerging from the locations of the imaged region comprise photoelectrons generated by photons of the photon source.

24. The examining system according to claim 23, further comprising a deflector having a movable mirror to displace the illuminated field by movement of the mirror.

25. The examining system according to claim 1, wherein the illumination device comprises an electron source to illuminate the delimited field, and wherein the charged particles emerging from the locations of the imaged region of the object comprise at least one of secondary electrons, backscattering electrons and transmission electrons generated by electrons of the electron source.

26. The examining system according to claim 25, wherein the illumination device comprises at least one aperture structure for at least one of shaping an illumination beam, illuminating the delimited field and adjusting a numerical aperture of the illumination device.

27. The examining system according to claim 25, wherein the illumination device and the first deflector are disposed on opposite sides of the object plane and the illumination device comprises a second deflector to deflect the beam for displacing the delimited field, said second deflector being controllable by the controller.

28. The examining system according to claim 25, wherein the illumination device and the first deflector are disposed on a same side relative to the object plane.

29. The examining system according to claim 28, wherein a beam guiding device is provided to guide the electrons emitted by the electron source through a region of stationary beam cross-section towards the object, the electrons travelling towards the object also passing through the first deflector.

30. The examining system according to claim 29, wherein, when passing through the first deflector, the electrons travelling towards the object have a higher kinetic energy than the electrons travelling from the object to the detector, and wherein the first deflector is provided such that the deflection field generated by the same provides substantially equal deflections (M) for the electrons travelling towards the object and the electrons travelling from the object to the detector.

31. The examining system according to claim 30, wherein the first deflector comprises at least one region with an electric deflection field which is variable by the controller and a magnetic deflection field which is variable by the controller, with field directions of the electric deflection field and the magnetic deflection field as well as directions of movement of the electrons in this region being oriented in pairs substantially orthogonally to each other.

32. The examining system according to claim 31, wherein the controller controls the first deflector such that in the at least one region the relation $$B = k \cdot E$$

is substantially fulfilled, wherein

B is a field strength of the magnetic field in the region,

E is a field strength of the electric field in the region, and k is a constant.

33. The examining system according to claim 1, wherein an imaging energy filter for the charged particles is provided in the beam path between a region of stationary beam cross-section and the detector.

34. The examining system according to claim 1, wherein the first deflector comprises two deflection units configured to deflect charged particles through opposite deflection angles $\beta$ and $-\beta$.

* * * * *

UNITED STATES PATENT AND TRADEMARK OFFICE
CERTIFICATE OF CORRECTION

PATENT NO. : 6,903,337 B2
DATED : June 7, 2005
INVENTOR(S) : Oliver Kienzle et al.

It is certified that error appears in the above-identified patent and that said Letters Patent is hereby corrected as shown below:

Title page,
Item [56], References Cited, U.S. PATENT DOCUMENTS, "2001/0026929 A1" should read -- 2001/0025929 A1 --;
OTHER PUBLICATIONS, "G. Kerkhoff et al." reference, "Licht—Und Teilchenoptik" should read -- Licht- und Teilchenoptik --; and "Institut für angewandle Physik" should read -- Institut für angewandte Physik --;

Column 12,
Line 46, "the dimensions $z_1$, $Z_2$, $Z_3$, $Z_4$, $Z_5$ and $y_1$ are equal to the" should read -- the dimensions $z_1$, $z_2$, $z_3$, $z_4$, $z_5$ and $y_1$ are equal to the --;
Line 64, "insulating plates 105 extend in z-direction over a height $Z_4$" should read -- insulating plates 105 extend in z-direction over a height $z_4$ --;
Line 67, "plates 105, into the opening 55$f$ by a distance $Y_2$ of 2.5 mm." should read -- plates 105, into the opening 55$f$ by a distance $y_2$ of 2.5 mm. --;

Column 13,
Line 19, "As an alternative to the embodiment of the focusing lens" should read -- As an alternative to the embodiment of the focusing lens 15 --.

Signed and Sealed this

Thirteenth Day of September, 2005

JON W. DUDAS
*Director of the United States Patent and Trademark Office*